United States Patent
Yang

(10) Patent No.: US 12,432,923 B2
(45) Date of Patent: Sep. 30, 2025

(54) MEMORY DEVICE AND FABRICATION METHOD THEREOF

(71) Applicant: Yangtze Memory Technologies Co., Ltd., Wuhan (CN)

(72) Inventor: Yonggang Yang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 311 days.

(21) Appl. No.: 18/113,273

(22) Filed: Feb. 23, 2023

(65) Prior Publication Data
US 2024/0206165 A1 Jun. 20, 2024

Related U.S. Application Data

(60) Provisional application No. 63/432,489, filed on Dec. 14, 2022.

(30) Foreign Application Priority Data

Jan. 31, 2023 (CN) .......................... 202310099704.8

(51) Int. Cl.
| | | |
|---|---|---|
| *H10B 43/27* | (2023.01) | |
| *H01L 23/522* | (2006.01) | |
| *H01L 23/528* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/35* | (2023.01) | |

(52) U.S. Cl.
CPC .......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 43/35; H10B 43/10; H10B 41/10; H10B 41/35; H10B 41/27; H01L 23/5226; H01L 23/5283
See application file for complete search history.

(56) References Cited

PUBLICATIONS

Huo et al., CN 110767656, Feb. 7, 2020 (Year: 2020).*
Zhang et al., CN 111211129, May 29, 2020 (Year: 2020).*
Zhang et al., CN 11244096, Jun. 5, 2020 (Year: 2020).*
Yang et al., CN 114975465, Aug. 30, 2022 (Year: 2022).*

* cited by examiner

*Primary Examiner* — Mary Ellen Bowman
(74) *Attorney, Agent, or Firm* — Anova Law Group, PLLC

(57) ABSTRACT

A memory device fabrication method includes providing a semiconductor structure having a core area and a contact area arranged next to each other along a first direction. The semiconductor structure includes dielectric layer pairs that include first and second dielectric layers stacked in an alternating manner in a second direction approximately perpendicular to the first direction. The method further includes performing etching to form channel holes penetrating the dielectric layer pairs. The channel holes include first channel holes in the contact area and second channel holes in the core area. The first channel holes surround a contact region. The method also includes substituting portions of the second dielectric layers that surround the plurality of first channel holes with a protection material to form a protection wall that surrounds the contact region.

20 Claims, 24 Drawing Sheets

MEMORY DEVICE AND FABRICATION METHOD THEREOF

CROSS-REFERENCE TO RELATED APPLICATION

This application claims the benefit of Provisional Application No. 63/432,489, filed on Dec. 14, 2022, and claims the priority of Chinese Patent Application No. 202310099704.8, filed on Jan. 31, 2023, the content of all of which is incorporated herein by reference in their entirety.

FIELD OF THE TECHNOLOGY

This application relates to the field of semiconductor technology and, more particularly, to a memory device and a fabrication method thereof.

BACKGROUND OF THE DISCLOSURE

Three-dimensional (3D) memory devices, such as 3D NAND memory devices, are promising memory devices with the potential of having a much higher storage density than conventional planar memories, and can meet the growing demands of consumer electronics, cloud computing, and big data for larger capacity and better performance. A 3D memory device usually includes multiple stack layers in a single chip to achieve a higher density, a higher capacity, a faster performance, a lower power consumption, and a better cost efficiency.

SUMMARY

In accordance with the disclosure, there is provided a memory device fabrication method including providing a semiconductor structure. The semiconductor structure has a core area and a contact area arranged next to each other along a first direction. The semiconductor structure includes a plurality of dielectric layer pairs that include a plurality of first dielectric layers and a plurality of second dielectric layers stacked in an alternating manner in a second direction. The second direction is approximately perpendicular to the first direction. The method further includes performing etching to form a plurality of channel holes penetrating the plurality of dielectric layer pairs. The plurality of channel holes include a plurality of first channel holes in the contact area and a plurality of second channel holes in the core area. The plurality of first channel holes surround a contact region. The method also includes substituting portions of the plurality of second dielectric layers that surround the plurality of first channel holes with a protection material to form a protection wall. The protection wall surrounds the contact region.

Also in accordance with the disclosure, there is provided a memory device having a contact area and a core area next to each other along a first direction. The memory device includes a plurality of first dielectric layers stacked in a second direction approximately perpendicular to the first direction and extending across the contact area and the core area, a plurality of second dielectric layers in a contact region in the contact area, and a plurality of conductor layers in the core area and in a protection region in the contact area. Each of the plurality of second dielectric layers is sandwiched between adjacent two of the plurality of first dielectric layers. The protection region surrounds the contact region. Each of the plurality of conductor layers is sandwiched between adjacent two of the plurality of first dielectric layers and is co-layered with one of the plurality of second dielectric layers.

Also in accordance with the disclosure, there is provided a memory system including a memory device and a memory controller configured to control operation of the memory device. The memory device has a contact area and a core area next to each other along a first direction. The memory device includes a plurality of first dielectric layers stacked in a second direction approximately perpendicular to the first direction and extending across the contact area and the core area, a plurality of second dielectric layers in a contact region in the contact area, and a plurality of conductor layers in the core area and in a protection region in the contact area. Each of the plurality of second dielectric layers is sandwiched between adjacent two of the plurality of first dielectric layers. The protection region surrounds the contact region. Each of the plurality of conductor layers is sandwiched between adjacent two of the plurality of first dielectric layers and is co-layered with one of the plurality of second dielectric layers.

DESCRIPTION OF EMBODIMENTS

Figure 1A:
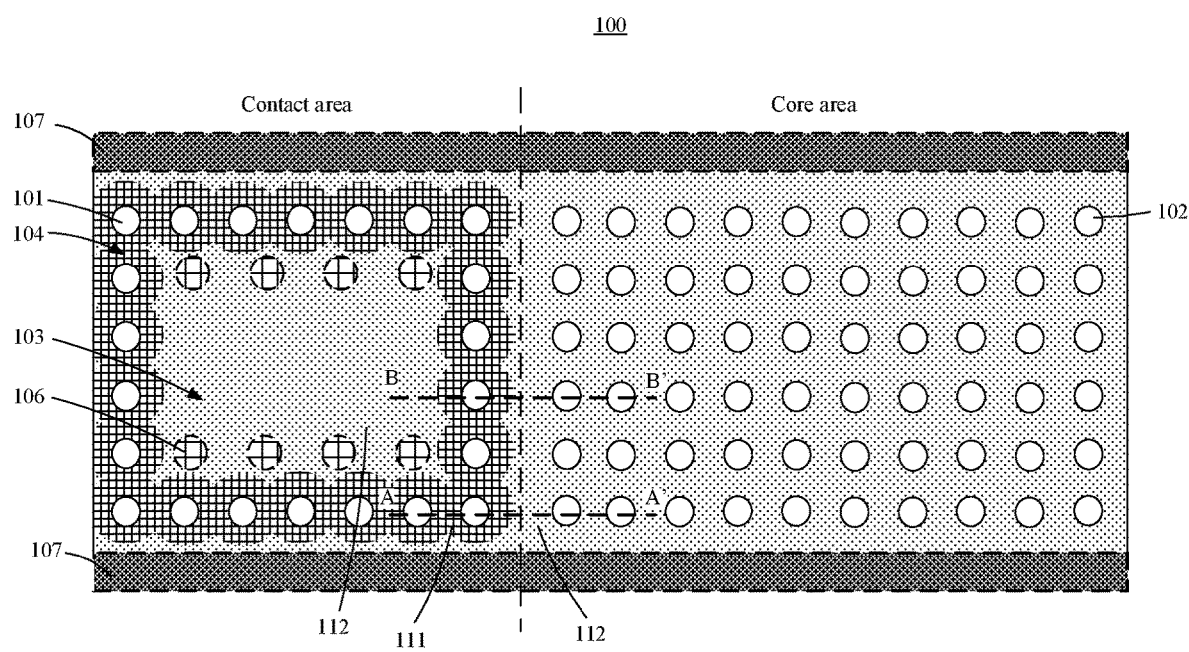
FIG. 1A is a schematic horizontal cross-sectional diagram showing a portion of a semiconductor structure at a certain stage of a method of fabricating a three-dimensional (3D) memory device consistent with the present disclosure.

The following describes the technical solutions in the embodiments of the present disclosure with reference to the accompanying drawings. Wherever possible, the same reference numbers will be used throughout the drawings to refer to the same or like parts. The described embodiments are merely some but not all of the embodiments of the present disclosure. Other embodiments obtained by a person skilled in the art based on the embodiments of the present disclosure without creative efforts shall fall within the scope of the present disclosure.

References in the specification to "one embodiment," "an embodiment," "an exemplary embodiment," "some embodiments," etc., indicate that the embodiment described may include a particular feature, structure, or characteristic, but not every embodiment necessarily includes the particular feature, structure, or characteristic. Moreover, such phrases do not necessarily refer to the same embodiment.

Further, when a particular feature, structure or characteristic is described in connection with an embodiment, it would be within the knowledge of a person skilled in the art to affect such feature, structure or characteristic in connection with other embodiments whether or not explicitly described. A person of ordinary skill in the art can make modifications to the described embodiments according to the principle of the present disclosure. For example, one or more components of the disclosed device can be omitted or one or more components not explicitly described above can be added to the device. Similarly, one or more steps in the disclosed method can be omitted or one or more steps not explicitly described above can be included in the method.

Unless otherwise defined, all technical and scientific terms used in this disclosure have the same or similar meanings as generally understood by those having ordinary skill in the art. As described herein, the terms used in the specification of the present disclosure are intended to describe example embodiments, instead of limiting the present disclosure. In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," may be understood to convey a singular usage or to convey a plural usage, depending at least in part upon context.

As used herein, when a first component is referred to as "fixed to" a second component, it is intended that the first component may be directly attached to the second component or may be indirectly attached to the second component via another component. When a first component is referred to as "connecting" to a second component, it is intended that the first component may be directly connected to the second component or may be indirectly connected to the second component via a third component between them. The terms "vertical," "horizontal," "up," "down," "left," "right," "perpendicular," "parallel," and similar expressions used herein, are merely intended for purposes of description. For example, phrases indicating directions, such as "vertical," "horizontal," "up," "down," "left," and "right," are to be understood as indicating the directions in the drawings with the orientation shown therein. The term "and/or" used herein includes any suitable combination of one or more related items listed.

In this disclosure, a value or a range of values may refer to a desired, target, or nominal value or range of values and can include slight variations. The term "about" or "approximately" associated with a value can allow a variation within, for example, 10% of the value, such as ±2%, ±5%, or ±10% of the value, or another proper variation as appreciated by those having ordinary skill in the art. The term "about" or "approximately" associated with a state can allow a slight deviation from the state. For example, a first component being approximately perpendicular to a second component can indicate that the first component is either exactly perpendicular to the second component or slightly deviates from being perpendicular to the second component, and an angle between the first and second components can be within a range from, e.g., 80° to 100°, or another proper range as appreciated by those having ordinary skill in the art.

FIGS. 1A-6 are diagrams showing a semiconductor structure at certain stages of a method of fabricating a three-dimensional (3D) memory device according to some embodiments of the present disclosure. Each of FIGS. 1A-6 only shows a portion of the semiconductor structure for fabricating the 3D memory device. The 3D memory device can include, e.g., a 3D NAND-type memory device.

Figure 1B:
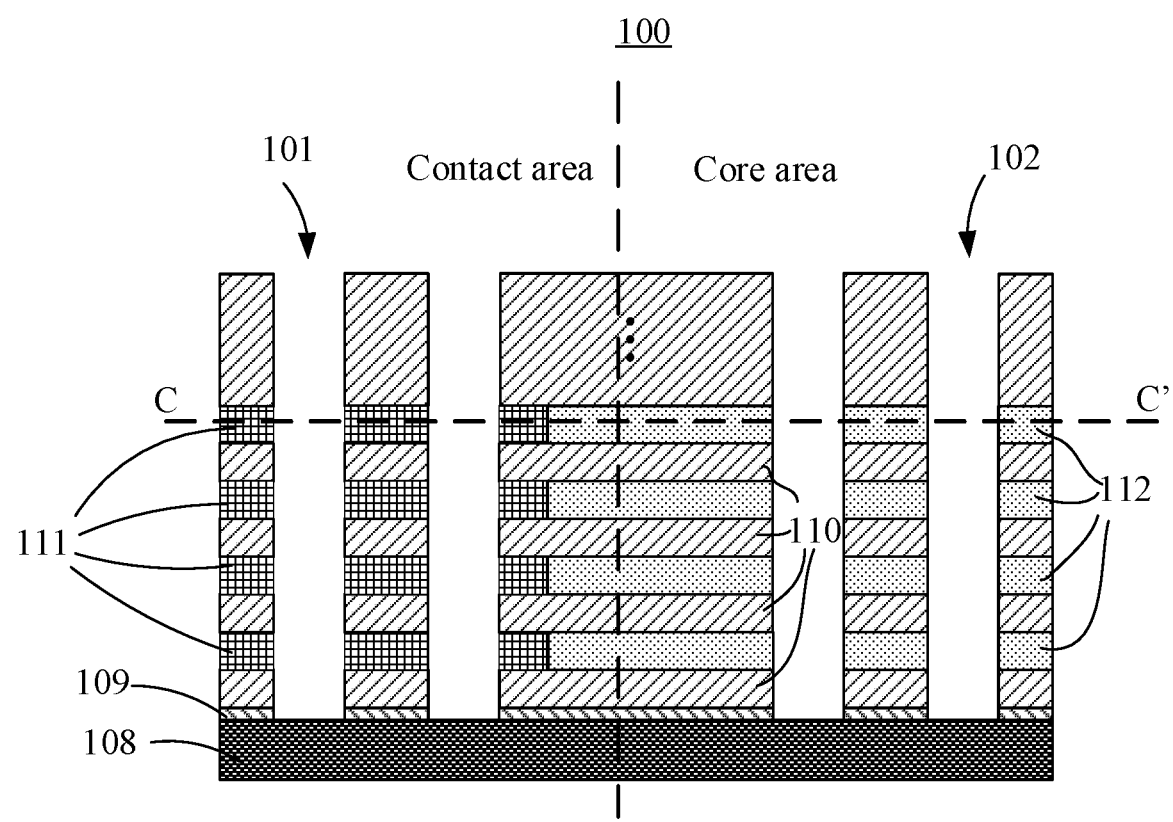
FIG. 1B is a schematic vertical cross-sectional diagram along line A-A' in FIG. 1A.
Figure 1C:
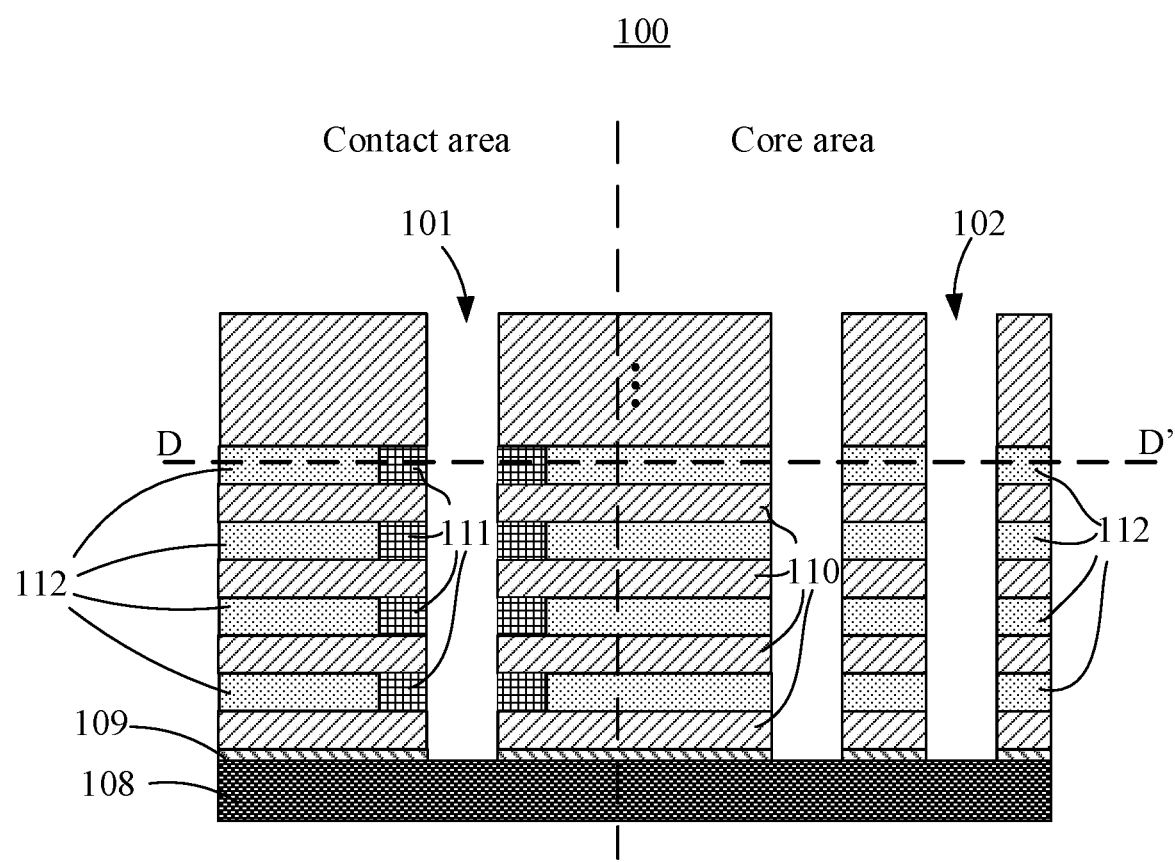
FIG. 1C is a schematic vertical cross-sectional diagram along line B-B' in FIG. 1A.

FIGS. 1A-1D schematically show a semiconductor structure 100, e.g., a processing wafer, at a certain stage of the method of fabricating the 3D memory device according to some embodiments of the present disclosure. FIGS. 1B and 1C are vertical cross-sectional views along line A-A' and line B-B' in FIG. 1A, respectively, and FIG. 1A is a horizontal cross-sectional view along line C-C' in FIG. 1B or line D-D' in FIG. 1C. As shown in FIG. 1A, the semiconductor structure 100 includes a contact area and a core area arranged next to each other along a first direction approximately parallel to a surface of the semiconductor structure 100. The first direction can be, for example, a horizontal direction in FIGS. 1A-1C. The core area includes memory cell array. The contact area can include, for example, one or more through contact structures. For example, further processing, such as photolithography, etching, and deposition processes, can be performed to form the one or more through contact structures (e.g., contact formation), as described in more detail below.

The semiconductor structure 100 includes a plurality of first channel holes 101 (also referred to as "dummy channel holes") in the contact area and a plurality of second channel holes 102 (also referred to as "memory channel holes") in the core area. The plurality of first channel holes 101 and the plurality of second channel holes 102 can be formed through an etching process. In some embodiments, the plurality of first channel holes 101 and the plurality of second channel holes 102 can be formed simultaneously, such as through a single etching process.

The contact area of the semiconductor structure 100 further includes a contact region 103 and a protection region 104 surrounding the contact region 103. The plurality of first channel holes 101 are arranged within the protection region 104. Further, one or more through contact structures 106 will be formed in the contact region 103 through further processing. The one or more through contact structures 106 are not yet formed in the semiconductor structure 100 at the stage shown in FIG. 1A, and dashed rectangles are used in FIG. 1A to mark the positions corresponding to the through contact structures 106.

Gate line slits 107 will also be formed in the semiconductor structure 100 through further processing including an etching process, e.g., a wet or dry etching process. The gate line slits 107 are not yet formed in the semiconductor structure 100 at the stage shown in FIG. 1A, and dashed rectangles are used in FIG. 1A to mark the positions corresponding to the gate line slits 107. As shown in FIG. 1A, each pair of neighboring gate line slits 107 sandwich a portion the contact area and a portion of the core area.

Further, as shown in FIG. 1B, the semiconductor structure 100 includes a bottom layer, and the bottom layer includes a substrate 108. The substrate 108 can be formed of one or more suitable semiconductor materials, such as silicon, germanium, silicon germanium, indium phosphide, gallium arsenide, gallium nitride, or silicon carbide, or a combination of suitable semiconductor and insulation materials, such as silicon on insulator. Further, the substrate 108 can be single crystalline, polycrystalline, amorphous, or a combination thereof.

In some embodiments, as shown in FIG. 1B, the bottom layer further includes an insulation layer 109 provided on an upper surface of the substrate 108. The insulation layer 109 can include any suitable material, such as one or more dielectric materials, e.g., one or more of silicon oxide, silicon nitride, and silicon oxynitride. In the example shown in FIGS. 1B and 1C, the plurality of first channel holes 101 and the plurality of second channel holes 102 penetrate the insulation layer 109. In some other embodiments, the plurality of first channel holes 101 and the plurality of second channel holes 102 do not penetrate the insulation layer 109, and the insulation layer 109 serve as bottom wall for the plurality of first channel holes 101 and the plurality of second channel holes 102.

As shown in FIGS. 1B and 1C, the semiconductor structure 100 includes a plurality of first dielectric layers 110 provided over the bottom layer and extending across the contact area and the core area. The semiconductor structure 100 further includes a plurality of protection layers 111 over the bottom layer and in the protection region 104 of the semiconductor structure 100. The plurality of first dielectric layers 110 and the plurality of protection layers 111 are stacked in an alternating manner along a second direction approximately perpendicular to the surface of the semiconductor structure 100 (and approximately perpendicular to the first direction). The second direction can be, for example, the vertical direction in FIGS. 1B and 1C.

Each of the plurality of first channel holes 101 penetrates the plurality of first dielectric layers 110 and the plurality of protection layers 111 in the second direction. The plurality of protection layers 111 form a protection wall in the protection region 104 as shown in FIG. 1A.

As shown in FIGS. 1B and 1C, the semiconductor structure 100 further includes a plurality of second dielectric layers 112 provided over the bottom layer. The plurality of second dielectric layers 112 are formed in the core area, as well as the contact area except the protection region 104. The plurality of first dielectric layers 110 and the plurality of second dielectric layers 112 are stacked in an alternating manner in the second direction. As shown in FIGS. 1B and 1C, each of the plurality of second dielectric layers 112 is co-layered with (i.e., in a same layer as) one of the plurality of protection layers 111. As described below, the plurality of protection layers 111 can be formed by replacing portions of the plurality of second dielectric layers 112 with a protection material for the protection layers 111.

As shown in FIGS. 1B and 1C, the plurality of second channel holes 102 penetrate the plurality of first dielectric layers 110 and the plurality of second dielectric layers 112 along the second direction. Further, as shown in FIGS. 1A and 1C, the protection wall formed by the plurality of protection layers 111 surrounds the contact region 103 and prevents the second dielectric layers 112 in the contact region 103 from being etched during the gate line slit etching process and/or a process of removing the plurality of second dielectric layers 112 described below. As shown in FIG. 1A, in a plan view of the semiconductor structure 100 (i.e., in a transverse direction parallel to the surface of the semiconductor structure 100, e.g., parallel to the first direction), the protection wall formed by the plurality of protection layers 111 can fully enclose the contact region 103. That is, in the plan view of the semiconductor structure 100, the protection wall is a continuous wall with no gap.

The first dielectric layers 110 can include any suitable material, such as one or more dielectric materials, e.g., one or more of silicon oxide, silicon nitride, and silicon oxynitride. The second dielectric layers 112 can function as sacrificial layers, and can include any suitable material different from that of the first dielectric layer 110, such as one or more dielectric materials, e.g., one or more of silicon oxide, silicon nitride, and silicon oxynitride. For example, the materials for the first dielectric layers 110 and the second dielectric layers 112 can be selected that an etchant used to remove the second dielectric layers 112 in the process described below may have no or very small impact on the first dielectric layers 110. In some embodiments, the first dielectric layers 110 can include silicon oxide and the second dielectric layers 112 can include silicon nitride. The protection material for forming the protection layers 111 can be any suitable material on which the etchant for etching the second dielectric layers 112 has no or very small impact. In some embodiments, the protection material can include polysilicon.

In some embodiments, the protection region 104 can have a shape of a rectangle, rhombus, square, hexagon, or another polygon, or a circle, etc., as long as the protection region 104 can surround the contact region 103, and the plurality of first channel holes 101 can be arranged correspondingly. For example, as shown in FIG. 1A, the protection region 104 has a rectangular shape surrounding the contact region 103, and the plurality of first channel holes 101 are arranged along four sides of the rectangle. Each of two parallel sides of the rectangle includes a single row of first channel holes 101, and each of other two parallel sides of the rectangle includes a single column of first channel holes 101. In some other embodiments, the plurality of first channel holes 101 may be arranged in different manners. For example, each side of the rectangle can include two or more rows/columns of first channel holes 101.

In the cross-sectional view of the semiconductor structure 100 along the first direction (e.g., the horizontal direction), the plurality of first channel holes 101, the plurality of second channel holes 102, and the through contact structures 106 can have same or different shapes, such as rectangle, rhombus, square, hexagon, or another polygon, or a circle, or any other suitable shapes.

In some embodiments, as shown in FIG. 1A, the plurality of first channel holes 101, the plurality of second channel holes 102, and the through contact structures 106 have a circular shape. Correspondingly, the protection wall in the protection region 104 has a wavy side surface. That is, the protection wall can have a first width at a position corresponding to a first channel hole 101 and a second width at a position at a point, such as a middle point, between two neighboring first channel holes 101, and the first width is greater than the second width.

Figure 1D:
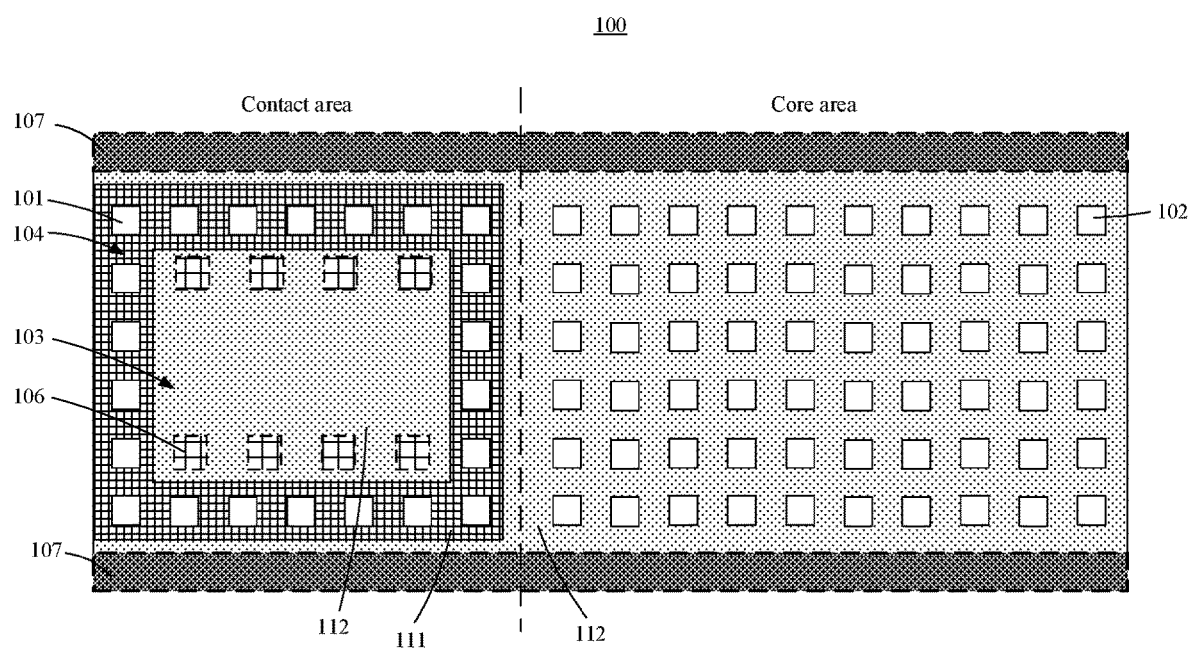
FIG. 1D is a schematic horizontal cross-sectional diagram showing a portion of another semiconductor structure at a certain stage of a method of fabricating a three-dimensional (3D) memory device consistent with the present disclosure.

In some other embodiments, as shown in FIG. 1D, the plurality of first channel holes 101, the plurality of second channel holes 102, and the through contact structures 106 have a rectangular shape. Correspondingly, the protection wall in the protection region 104 has an approximately flat side surface.

In some embodiments, as shown in FIGS. 1A and 2-6, the plurality of first channel holes 101 are arranged at proximity to edges of the contact area to surround the contact region 103. As such, the contact region 103 can have a relatively large dimension.

In some embodiments, a portion of the plurality of first channel holes 101 are arranged distal to the core area. For example, as shown in FIGS. 1A and 2-6, a portion of the plurality of first channel holes 101 are arranged along an edge of the semiconductor structure 100 distal to the core area.

FIGS. 2-6 are schematic diagrams showing the semiconductor structure 100 at various stages of the method of fabricating the 3D memory device according to some embodiments of the present disclosure. The stages of FIGS. 2-6 can be in a sequential order after the stage shown in FIGS. 1A-1C.

Figure 2:
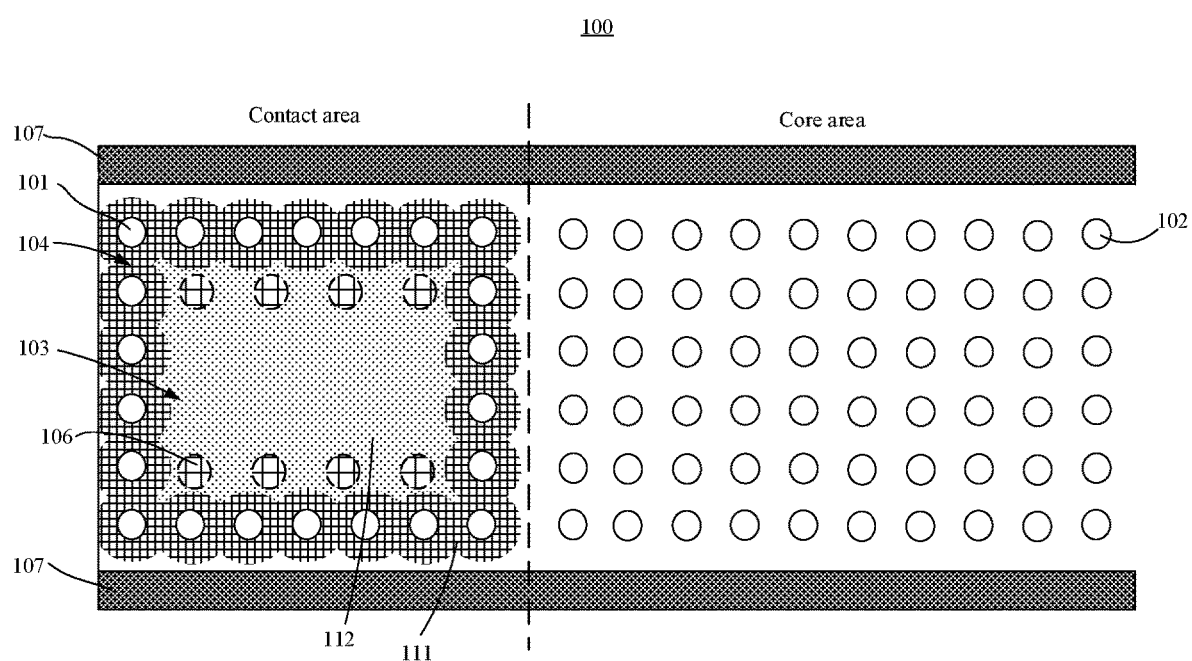
FIGS. 2-6 are schematic horizontal cross-sectional diagrams showing the semiconductor structure at various stages of the method of fabricating the 3D memory device consistent with the present disclosure.

As shown in FIG. 2, the gate line slits 107 are formed by, e.g., etching. Then, the semiconductor structure 100 is processed to remove the plurality of second dielectric layers 112 in the core area and to remove the plurality of second dielectric layers 112 in the contact area except the portions of the plurality of second dielectric layers 112 in the contact region 103. The removal of the plurality of second dielectric layers 112 (except the portions thereof in the contact region 103) can be realized via an etching process, e.g., dry etching and/or wet etching. During the etching process, the plurality of protection layers 111 can prevent the portions of the plurality of second dielectric layers 112 in contact region 103 (i.e., inside the protection region 104) from being etched. During the etching process to remove the plurality of second dielectric layers 112, the plurality of protection layers 111 can remain physically and chemically stable. As a result of the etching process, except in the contact region 103 and the protection region 104, empty spaces are each formed between adjacent two of the plurality of first dielectric layers 110, i.e., each pair of adjacent two of the plurality of first dielectric layers 110 sandwich an empty space.

According to the present disclosure, during the etching process to remove the plurality of second dielectric layers 112, the plurality of protection layers 111 can function as etching stop layers, which can allow, e.g., an over etching process to be employed. Compared to controlling etching time and/or an amount/concentration of an etchant to stop the etching process, an over etching process using the plurality of protection layers 111 as etching stop layers can reduce the difficulty of the etching process, improve the etching precision, and efficiently ensure that each word line in the contact area have a uniform dimension in a the transverse direction.

In addition, the formation of the protection wall can separate the contact area and the core area, and prevent the interference between processes performed on the two areas.

Figure 3:
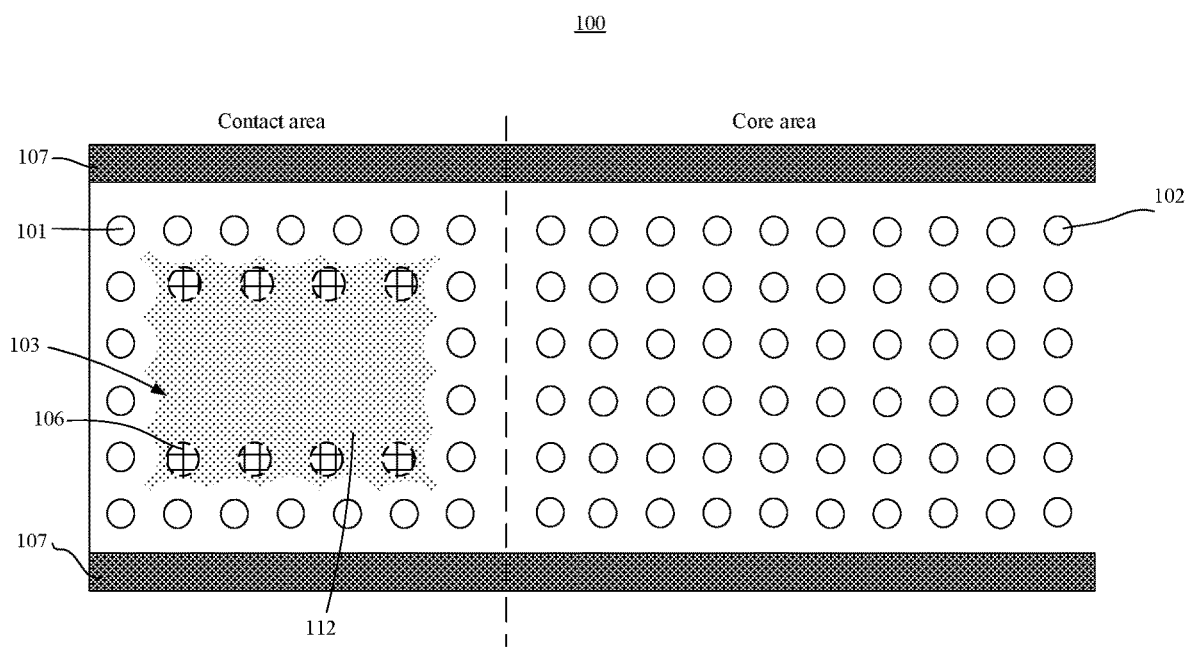

As shown in FIG. 3, the semiconductor structure 100 is further processed to remove the plurality of protection layers 111. That is, the protection wall is removed. The contact region 103, and hence the plurality of second dielectric layers 112 in the contact region 103, are no longer protected from etching by the protection region 104.

Due to the removal of the protection layers 111, empty spaces are also formed between adjacent two of the plurality of first dielectric layers 110 in the region where the protection layers 111 were.

Figure 4:
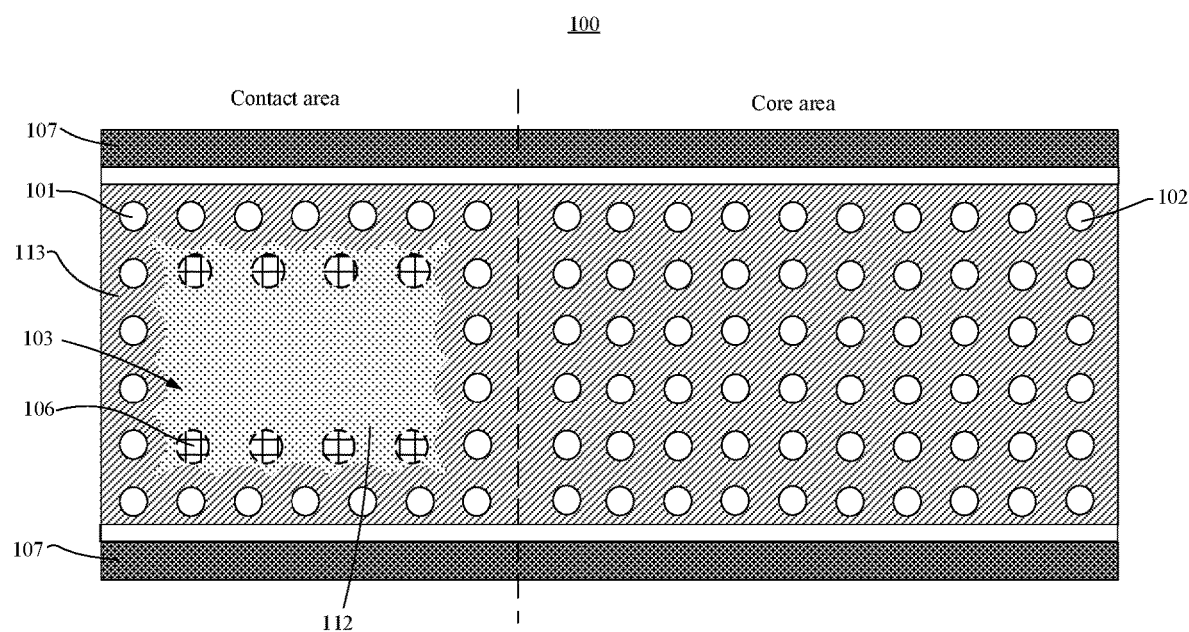

As shown in FIG. 4, one or more conductive materials are filled in the empty spaces between adjacent two of the plurality of first dielectric layers 110 to form a plurality of conductor layers 113. The plurality of conductor layers in the protection region 104 can form a conductor wall surrounding the contact region 103. Similar to the protection wall described above, the conductor wall can also have a wavy side surface. That is, the side surface of the conductor wall can protrude towards the contact region 103 at a position corresponding to a first channel hole 101 (and hence a first channel structure in the final memory device) further than at a position corresponding to a point, such as a middle point, between two neighboring first channel holes 101 (and hence two neighboring first channel structures in the final memory device).

Figure 5:
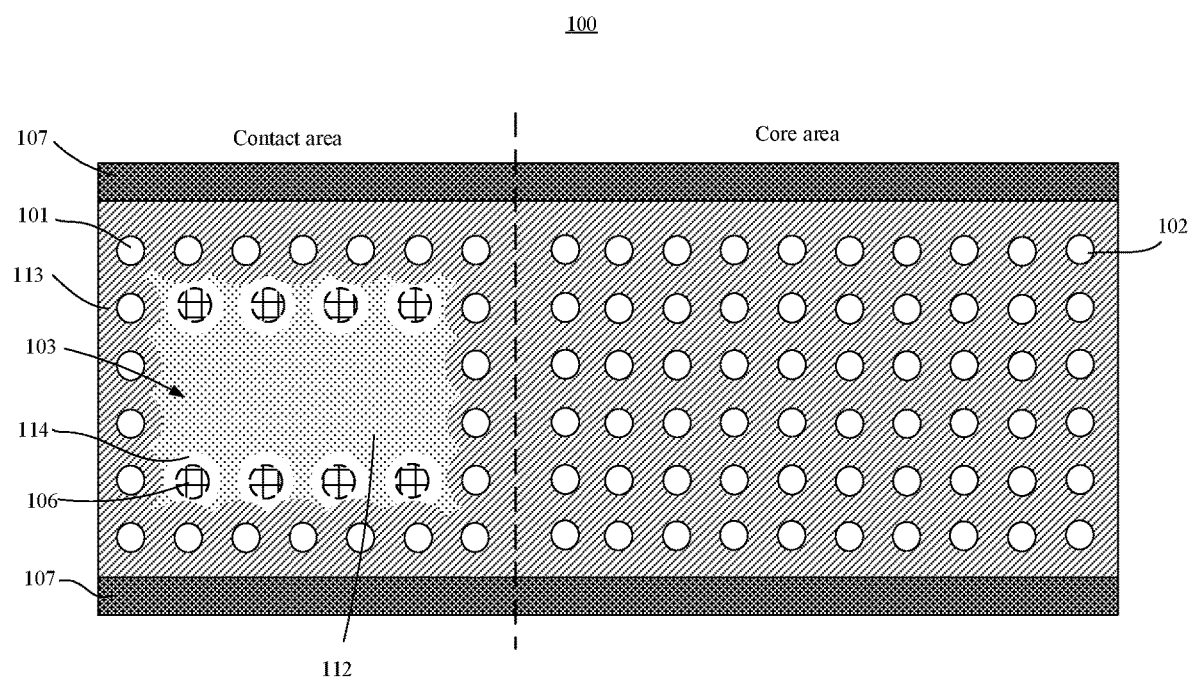

As shown in FIG. 5, etching process is performed to form one or more contact holes at one or more positions in the contact region 103 for forming the one or more through contact structures 106. The same or a separate etching process is also performed to remove portions of the plurality of second dielectric layers 112 surrounding the one or more contact holes to form one or more recesses 114 within the contact region 103.

In some embodiments, the contact holes and the one or more recess 114 have one-to-one correspondence. For example, each of the recesses 114 is formed on the same layer where the word line corresponding to the contact hole is located. Each of the recesses 114 is formed between two adjacent first dielectric layers 110 and exposes a portion of a side of a corresponding conductor layer 113.

Figure 6:
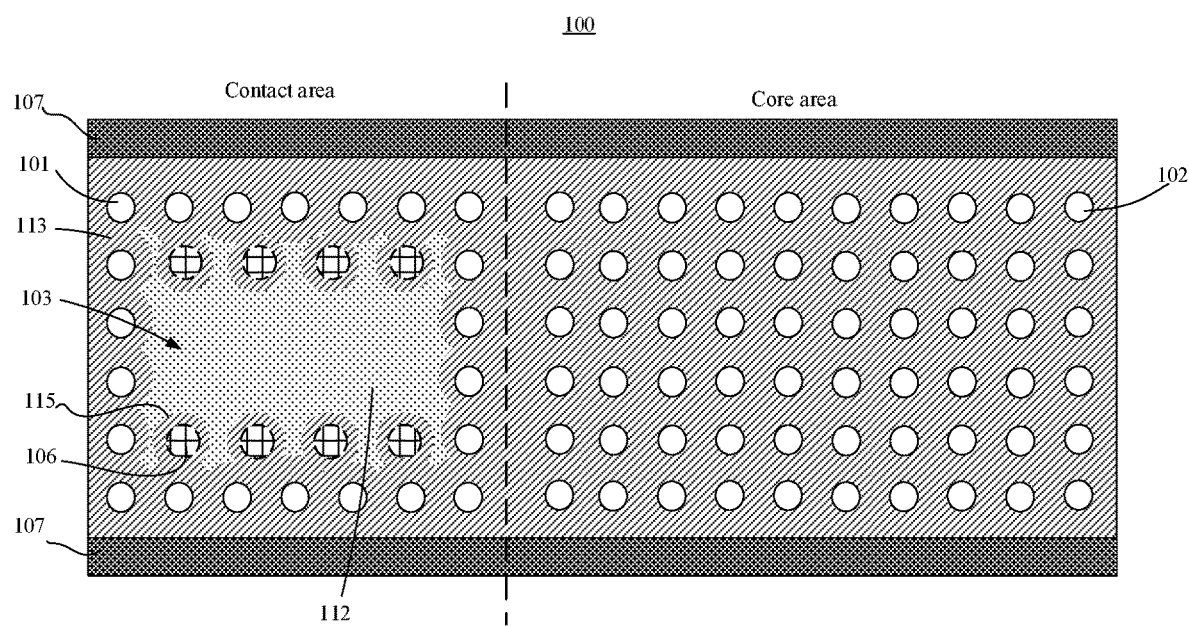

As shown in FIG. 6, one or more conductive materials are filled in the one or more contact holes and the one or more recesses 114, to form the one or more through contact structures 106 and one or more extensions 115. Each of the one or more extensions 115 connects a corresponding through contact structure 106 to a corresponding conductor layer 113 such that voltages can be applied to the conductor layer 113 via the corresponding through contact structures 106 and the corresponding extensions 115. In some embodiments, a dielectric layer is formed on the inner sidewall of each of the one or more contract holes before the one or more conductive materials are filled in the one or more contact holes.

Each of the through contact structures 106, the conductor layers 113, and the extensions 115 can include one or more conductive materials, such as one or more of tungsten, cobalt, copper, aluminum, doped silicon, and silicides. In some embodiments, each of the through contacts 106, each of the conductor layers 113, and/or each of the extensions 115 can include a composite layer including a plurality sub-layers, such as an AlO/TiN/W composite layer. The conductive materials or material structures for any two of the through contact structures 106, the conductor layers 113, and the extensions 115 can be same as or different from each other.

In some embodiments, the one or more through contact structures 106 and the extensions 115 are formed of the same constructive material. As such, there is no heterogeneous interface between the one or more through contact structures 106 and the extensions 115.

In some embodiments, in the contact region 103, the plurality of first dielectric layers 110 and the plurality of second dielectric layers 112 are not removed, and each contact hole (hence the corresponding through contact structure 106) is formed through one or more first dielectric layers 110 and/or one or more second dielectric layer 112 above the word line layer to which the through contact structure 106 is electrically coupled.

In some other embodiments, a staircase-like structure is formed in the contact region 103 through staircase processing, and each through contact structure 106 is formed to be connected to a corresponding step and hence electrically coupled to a corresponding word line layer.

Other processes for fabricating the 3D memory device can also be performed to form the other structures of the 3D memory device, such as filling conductive material, such as polysilicon, into the first channel holes 101 and the second channel holes 102 to form first channel structures and second channel structures, respectively, and forming wirings and other contact structures for electrical connections.

FIGS. 7A-7J are schematic diagrams showing various stages during a process of fabricating a 3D memory device according to some embodiments of the present disclosure. FIGS. 7A-7J are vertical cross-sectional views that can be considered as being taken along a line corresponding to line A-A' in FIG. 1A. At the end of the processes shown in FIGS. 7A-7J, the semiconductor structure can be in the status shown in FIGS. 1A-1C and ready for further processing, such as the processing described above in connection with FIGS. 1A-6.

Figure 7A:
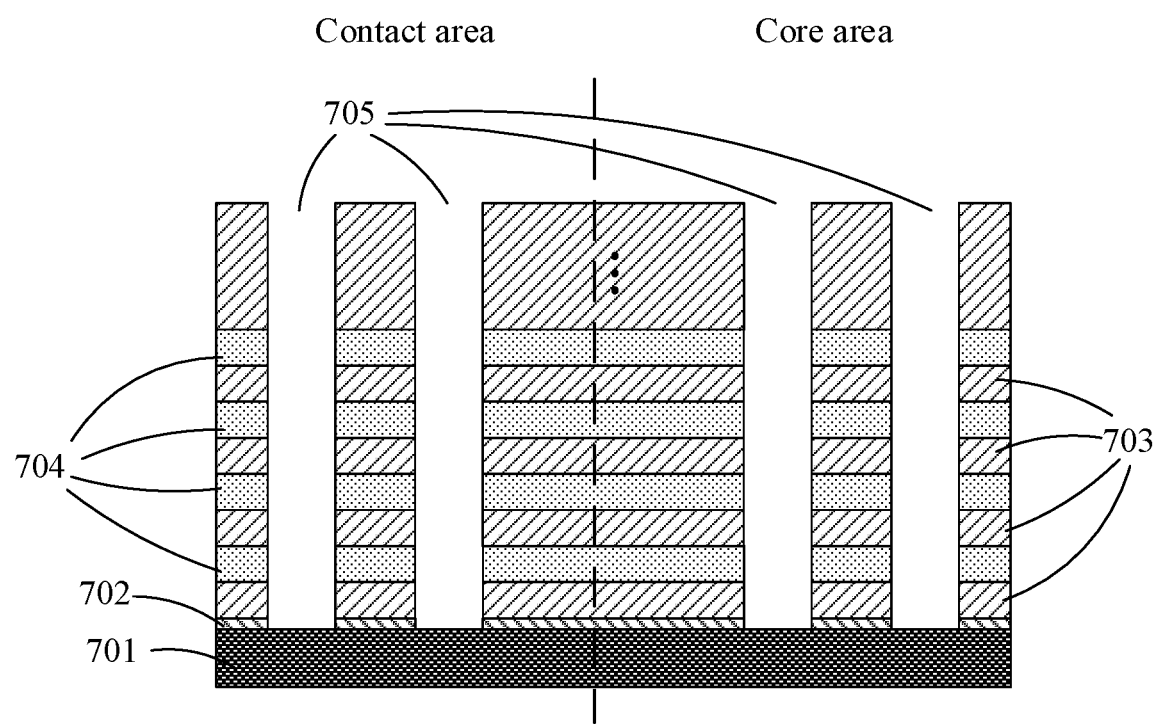
FIGS. 7A-7J are schematic vertical cross-sectional diagrams showing a portion of a semiconductor structure at various stages of a method of fabricating a 3D memory device consistent with the present disclosure.

As shown in FIG. 7A, a semiconductor structure is provided. The semiconductor structure can be a processing wafer. The semiconductor structure has a core area and a contact area arranged next to each other along a first direction approximately parallel to a surface of the semiconductor structure. The first direction can be, for example, the horizontal direction in FIGS. 7A-7J. The contact area are designed to include, through further processing, one or more through contact structures. For example, the further processing includes photolithography, etching, and deposition processes to form the one or more through contact structures (e.g., contact formation).

The semiconductor structure includes a bottom layer, and the bottom layer includes a substrate 701. The substrate 701 can be formed of one or more suitable semiconductor materials, such as silicon, germanium, silicon germanium, indium phosphide, gallium arsenide, gallium nitride, or silicon carbide, or a combination of suitable semiconductor and insulation materials, such as silicon on insulator. Further, the substrate 701 can be single crystalline, polycrystalline, amorphous, or a combination thereof. In some embodiments, as shown in FIG. 7A, the bottom layer further includes an insulation layer 702 provided over an upper surface of the substrate 701.

The semiconductor structure further includes a plurality of dielectric layer pairs over the bottom layer. The plurality of dielectric layer pairs include a plurality of first dielectric layers 703 and a plurality of second dielectric layers 704 stacked in an alternating manner in a second direction approximately perpendicular to the surface of the semiconductor structure (and approximately perpendicular to the first direction). The second direction can be, for example, the vertical direction in FIGS. 7A-7J.

The first dielectric layers 703 can include any suitable material, such as one or more dielectric materials, e.g., one or more of silicon oxide, silicon nitride, and silicon oxynitride. The second dielectric layers 704 can function as sacrificial layers. The second dielectric layers 704 can include any suitable material different from the first dielectric layer 703, such as one or more dielectric materials, e.g., one or more of silicon oxide, silicon nitride, and silicon oxynitride. For example, the first dielectric layers 703 can include silicon oxide and the second dielectric layers 704 can include silicon nitride. The first dielectric layer 703 and second dielectric layer 704 can be deposited in an alternating manner over the bottom layer.

In some embodiments, the method further includes performing etching to form a plurality of channel holes 705 each penetrating the plurality of dielectric layer pairs in the second direction. As shown in FIGS. 7A, the plurality of channel holes 705 include a plurality of first channel holes (dummy channel holes) in the contact area and a plurality of second channel holes (memory channel holes) in the core area. The plurality of first channel holes surround a contact region (e.g., the contact region 103 shown in FIGS. 1A-6) in the contact area.

The plurality of first channel holes and the plurality of second channel holes are formed through an etching process. In some embodiments, the plurality of first channel holes and the plurality of second channel holes can be formed simultaneously through same etching process.

In some embodiments, the method further includes substituting portions of the plurality of second dielectric layers 704 that surround the plurality of first channel holes with a protection material to form a protection wall. The protection wall surrounds the contact region and can prevent portions of the second dielectric layers 704 in the contact region from being etched during subsequent etching process. The substituting process is described in more detail below in connection with FIGS. 7B-7J.

Figure 7B:
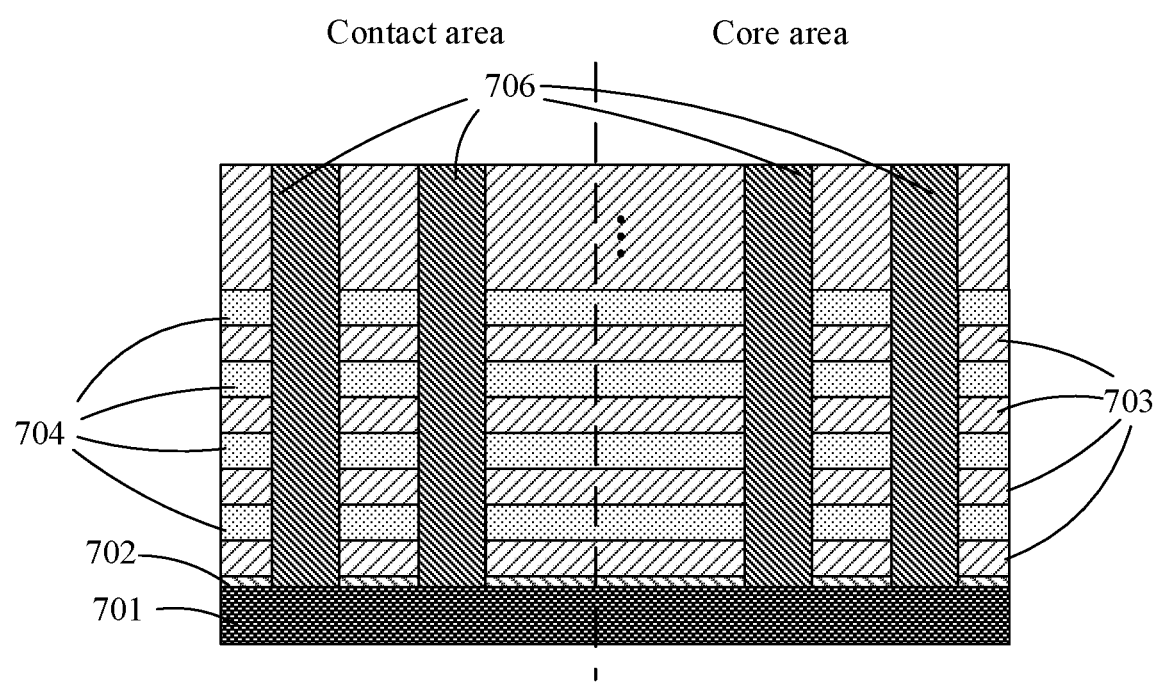

As shown in FIG. 7B, a sacrificial material is filled in the plurality of channel holes 705 to form a plurality of sacrificial films 706. The sacrificial material can include any suitable material, such as polysilicon or carbon. The sacrificial films 706 formed by filling the sacrificial material into the first channel holes in the contact area are also referred to as "first sacrificial films," and the sacrificial films 706 formed by filling the sacrificial material into the second channel holes in the core area are also referred to as "second sacrificial films."

Filling the plurality of channel holes 705 with the sacrificial material can be achieved by depositing the sacrificial material into the plurality of channel holes 705 and over the top surface of the semiconductor structure, and performing a polishing process to remove excess sacrificial material outside the plurality of channel holes 705. For example, the polishing process can include chemical mechanical polishing (CMP).

Figure 7C:
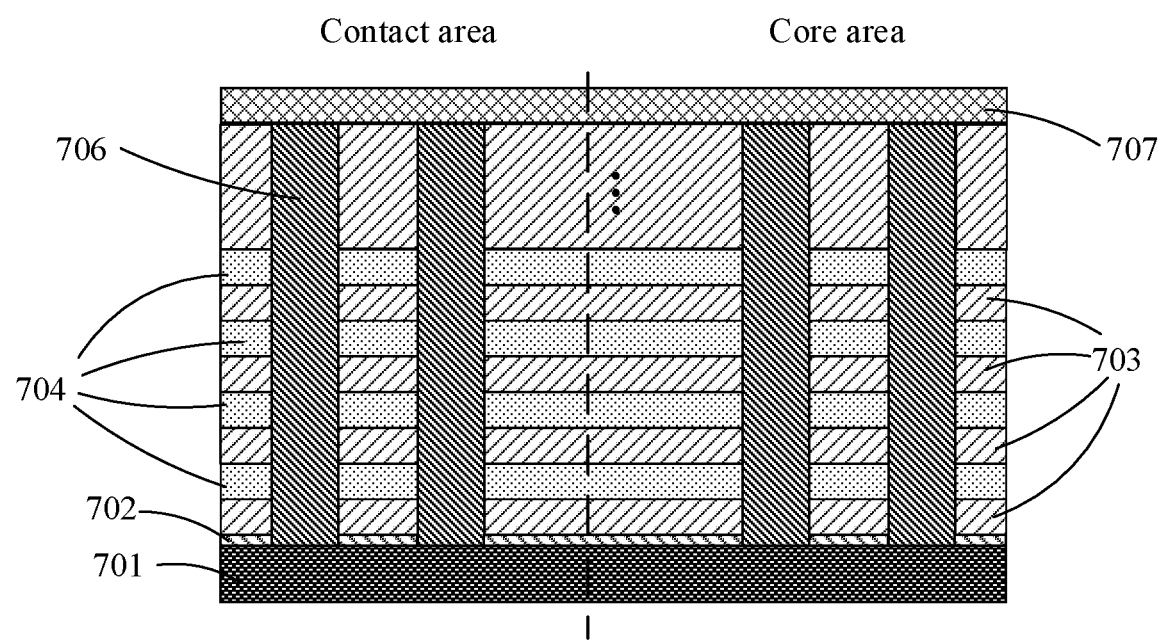

As shown in FIG. 7C, a cap film 707 is deposited over the plurality of dielectric layer pairs to cover an upper surface of the semiconductor structure. The cap film can include any suitable material, such as silicon oxide or polysilicon, that is different from the sacrificial material. For example, the cap film can be formed of polysilicon or silicon oxide.

In some embodiments, the sacrificial material can include carbon, and the cap film can be formed of polysilicon. In some other embodiments, the sacrificial material can include polysilicon, and the cap film can be formed of silicon oxide.

Figure 7D:
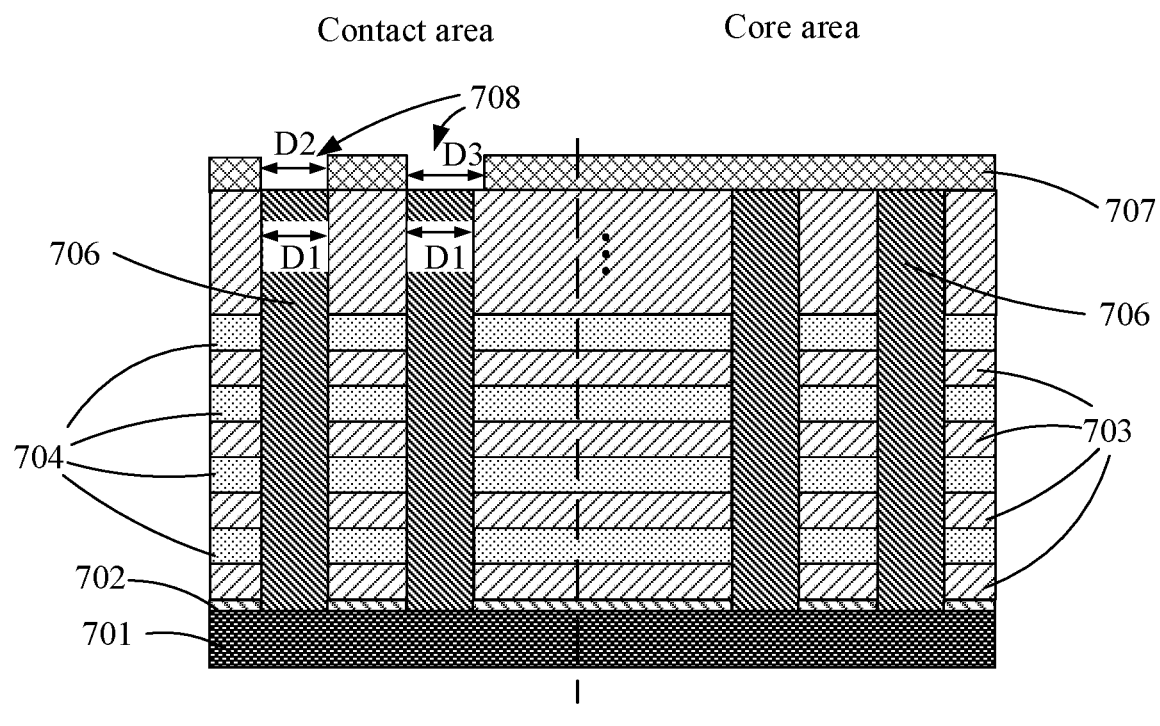

As shown in FIG. 7D, portions of the cap film are removed form openings (hereinafter referred to as "cap film holes") 708 that expose the sacrificial films 706 in the contact area (i.e., the first sacrificial films), while the core area, including the sacrificial films 706 in the core area (i.e., the second sacrificial films), is still covered by the cap film 707. The cap film 707 can be partially removed by, e.g., photolithography and etching (wet and/or dry etching).

The cap film holes 708 do not need to be perfectly aligned with the corresponding sacrificial films 706 (i.e., do not need to be perfectly aligned with the corresponding first channel holes). Further, an area of a cap film hole 708 can be greater than, equal to, or smaller than an area of the corresponding sacrificial film 706 (i.e., greater than, equal to, or smaller than an area of the corresponding first channel hole). For example, as shown in FIG. 7D, a dimension (such as a diameter) of a first channel hole (and hence of a first sacrificial film) is D1, a dimension of a cap film hole 708 is D2, and a dimension of another cap film hole 708 is D3. In the example shown in FIG. 7D, D2 approximately equals D1, and D3 is greater than D1. FIG. 7D shows the relative dimension relationship between the first channel holes and the one or more cap film holes 708 in one direction within a horizontal plane as an example.

Figure 7E:
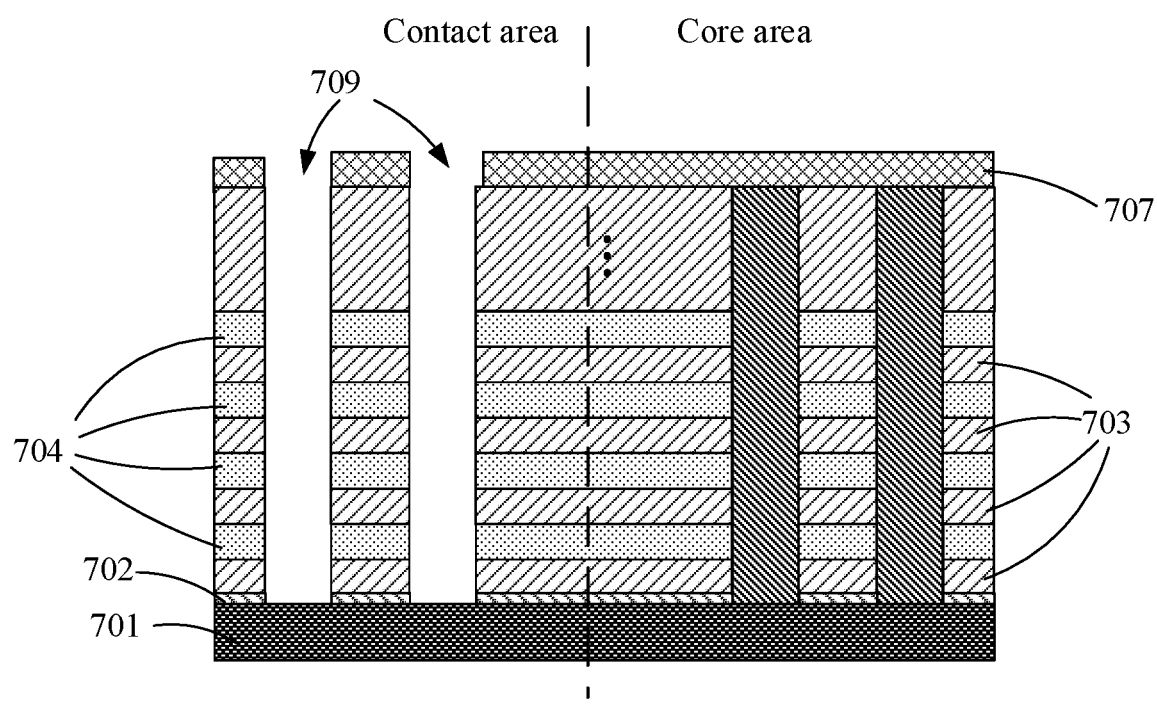

Then, as shown in FIG. 7E, the sacrificial films 708 in the contact area (i.e., the first sacrificial films) are removed using the remaining cap film 707 (the patterned cap film 707) as a mask, such that the channel holes 705 in the contact area are again exposed. The first sacrificial films can be removed by a method that is suitable for removing the sacrificial material. For example, the sacrificial material includes carbon and the first sacrificial films can be removed by ashing. As another example, the sacrificial material includes polysilicon and the first sacrificial films can be removed by etching. In the scenario that polysilicon is selected as the sacrificial material, the etching process described above in connection with FIG. 7A can be controlled not to etch the insulation layer 702 (i.e., the channel holes 705 do not penetrate the insulation layer 702). Thus, the insulation layer 702 can serve as an etch stop layer during the removal of the polysilicon sacrificial films, such that the substrate 701 will not be etched during this removal process.

As shown in FIG. 7E, at this stage, each channel hole 705 in the contact area (a first channel hole) and the corresponding cap film hole 708 form a through hole 709 that penetrates the cap film 707 and the plurality of dielectric layer pairs in the second direction.

Figure 7F:
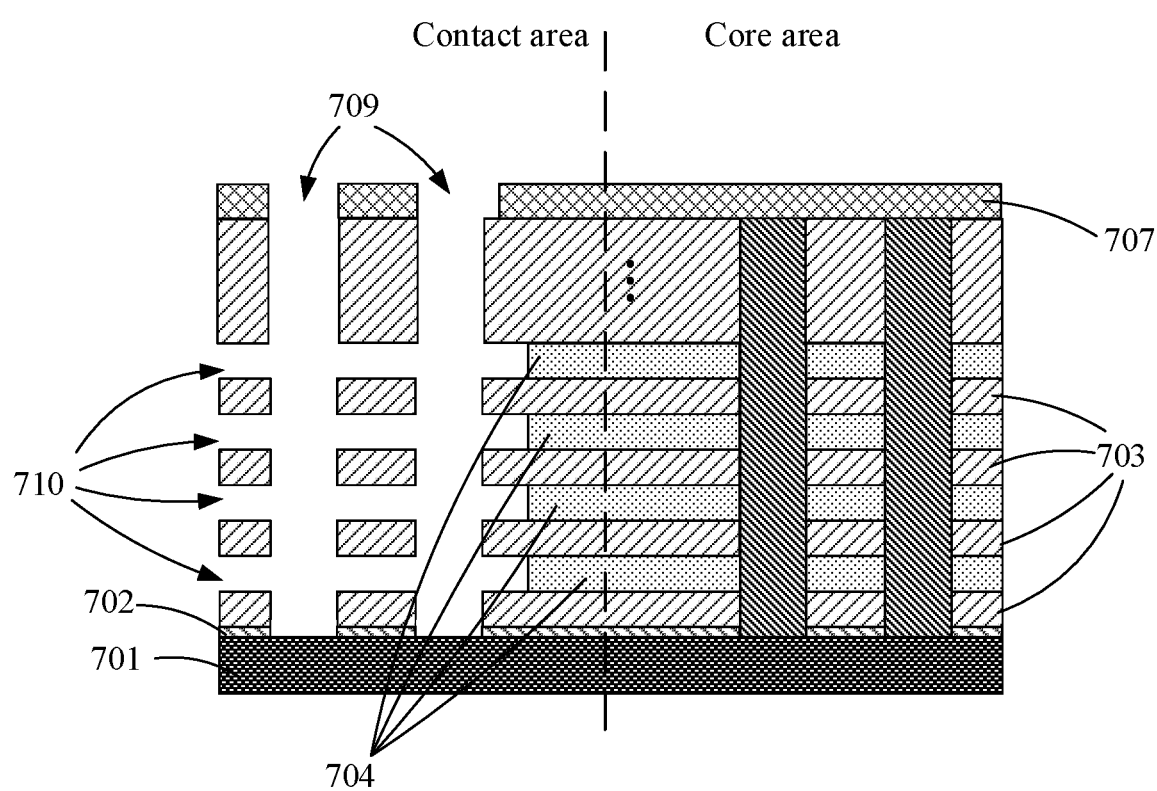

Then, as shown in FIG. 7F, portions of the plurality of second dielectric layers 704 that surround the plurality of first channel holes can be removed to form recesses 710 between adjacent two of the plurality of first dielectric layers 703 that surround the plurality of first channel holes. In some embodiments, an etchant can be entered into the plurality of first channel holes to etch the portions of the plurality of second dielectric layers 704 in the second direction. As shown in FIG. 7F, a recess 710 surrounding a first channel hole is connected to and in communication with a recess 710 surrounding an adjacent first channel hole to form a through channel.

Figure 7G:
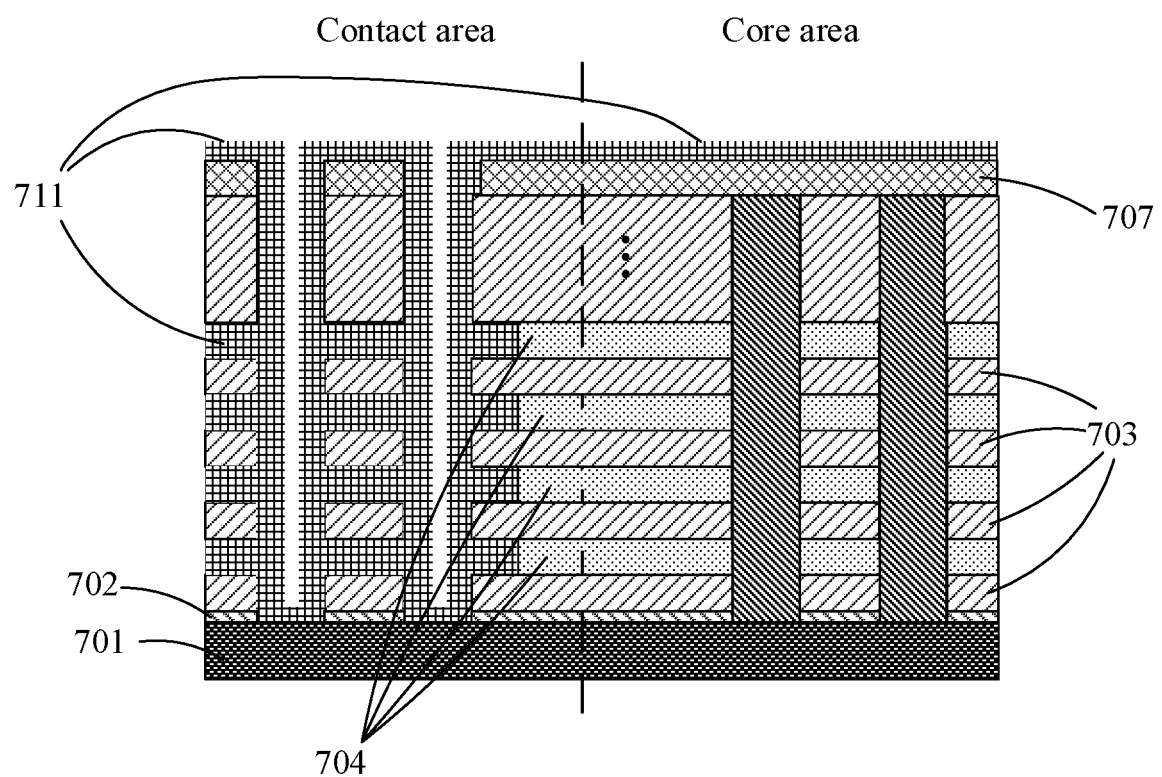
Figure 7H:
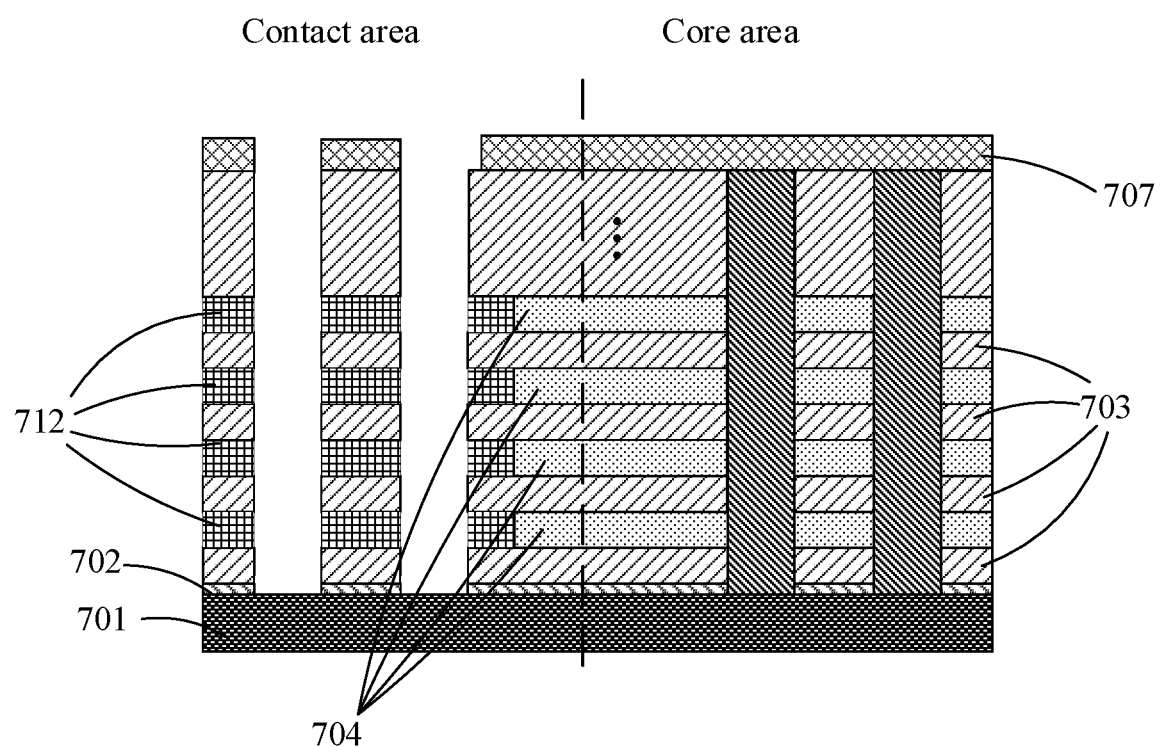

As shown in FIG. 7G, a protection film 711 is deposited to cover each of exposed surfaces and to fill the recesses 710 between adjacent two of the plurality of first dielectric layers that surround the plurality of first channel holes. A material for forming the protection film 711 can include, e.g., polysilicon. After the protection film 711 is deposited, an etching process is performed to remove the excess parts of the protection film 711 that are outside the recesses 710 (shown in FIG. 7H). At least portions of the protection film 711 in the recesses 710 remain not etched. The remaining parts of the protection film 711, i.e., those between adjacent two of the plurality of first dielectric layers, form a plurality of protection layers 712. The plurality of first dielectric layers 703 and the plurality of protection layers 712 are stacked in an alternating manner in the second direction in the contact area.

Figure 7I:
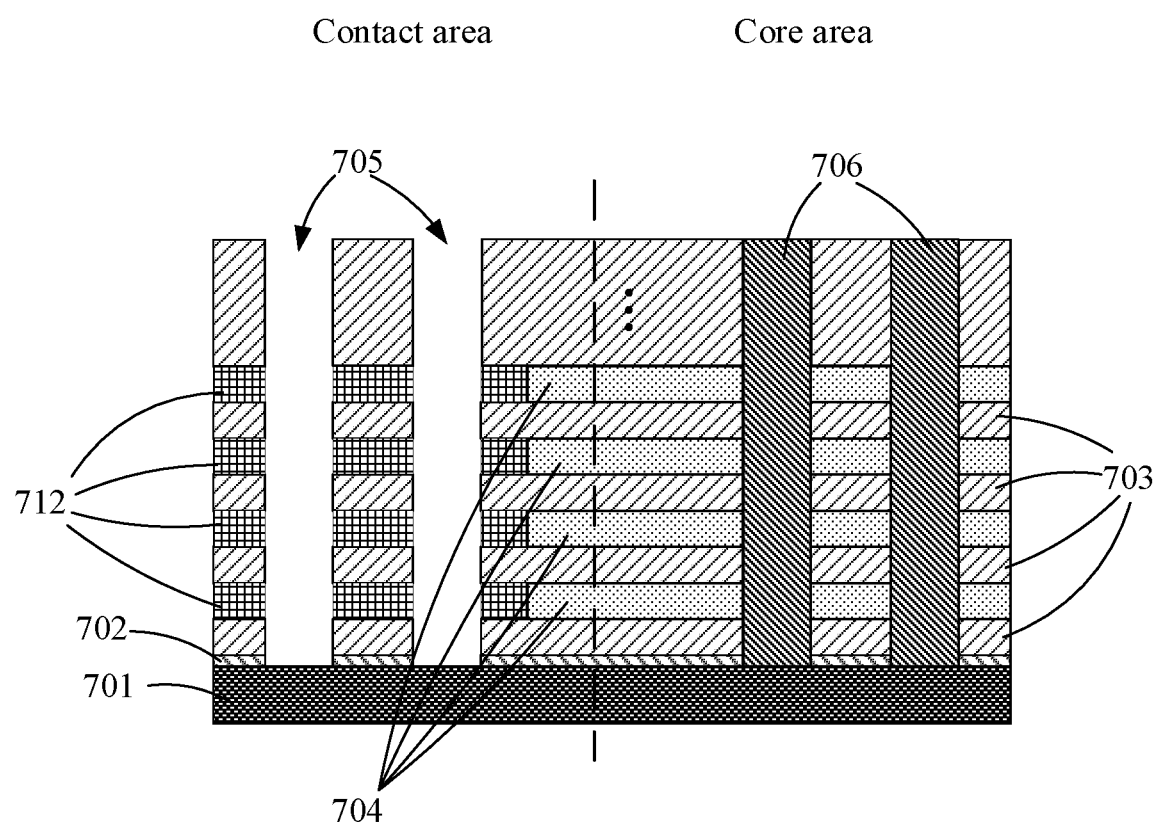

At the stage shown in FIG. 7I, the remaining cap film 707 is removed, exposing the sacrificial films 706 in the core area (i.e., the second sacrificial films). Then, at the stage shown in FIG. 7J, the sacrificial films 706 in the core area are removed through, e.g., an etching process, for example, using an etchant same as or similar to that used for removing the sacrificial films 706 in the contact area as described above.

Figure 7J:
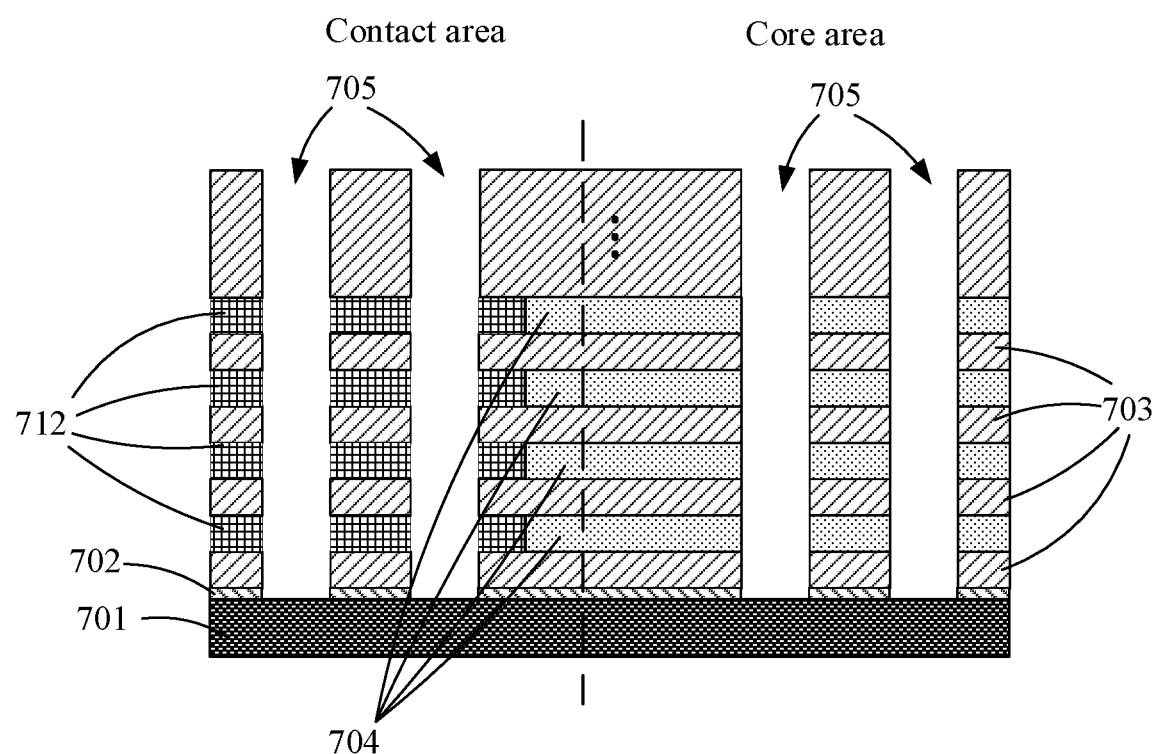

The semiconductor structure obtained at the stage shown in FIG. 7J can correspond to the semiconductor structure shown in FIGS. 1A-1C. The plurality of protection films 711 form a protection region (which can correspond to the protection region 104 shown in FIG. 1A) surrounding the contact region (which can correspond to the contact region 103 shown in FIG. 1A). Other structures of the semiconductor structure shown in FIG. 7J are similar to those of the semiconductor structure shown in FIGS. 1A-1C, and the descriptions of the structures shown in FIGS. 1A-1C can also be applied to those shown in FIG. 7J.

Figure 8A:
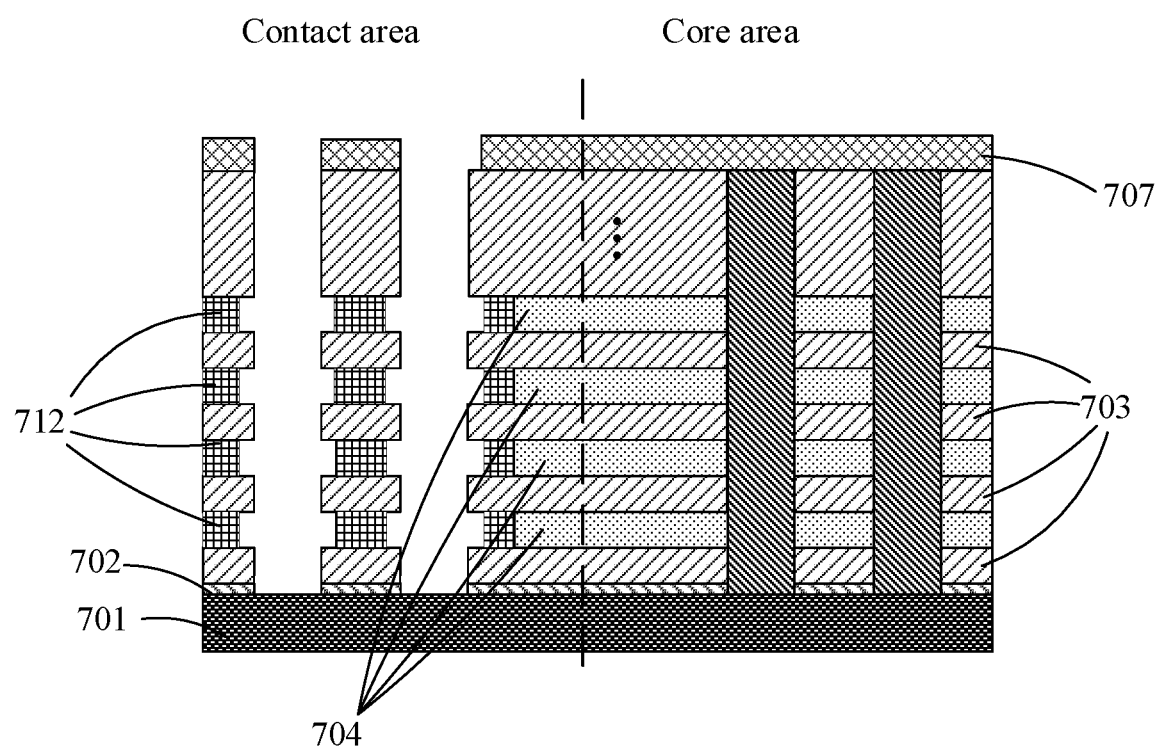
FIGS. 8A-8C are schematic vertical cross-sectional diagrams showing a portion of another semiconductor structure at various stages of a method of fabricating a 3D memory device consistent with the present disclosure.
Figure 8B:
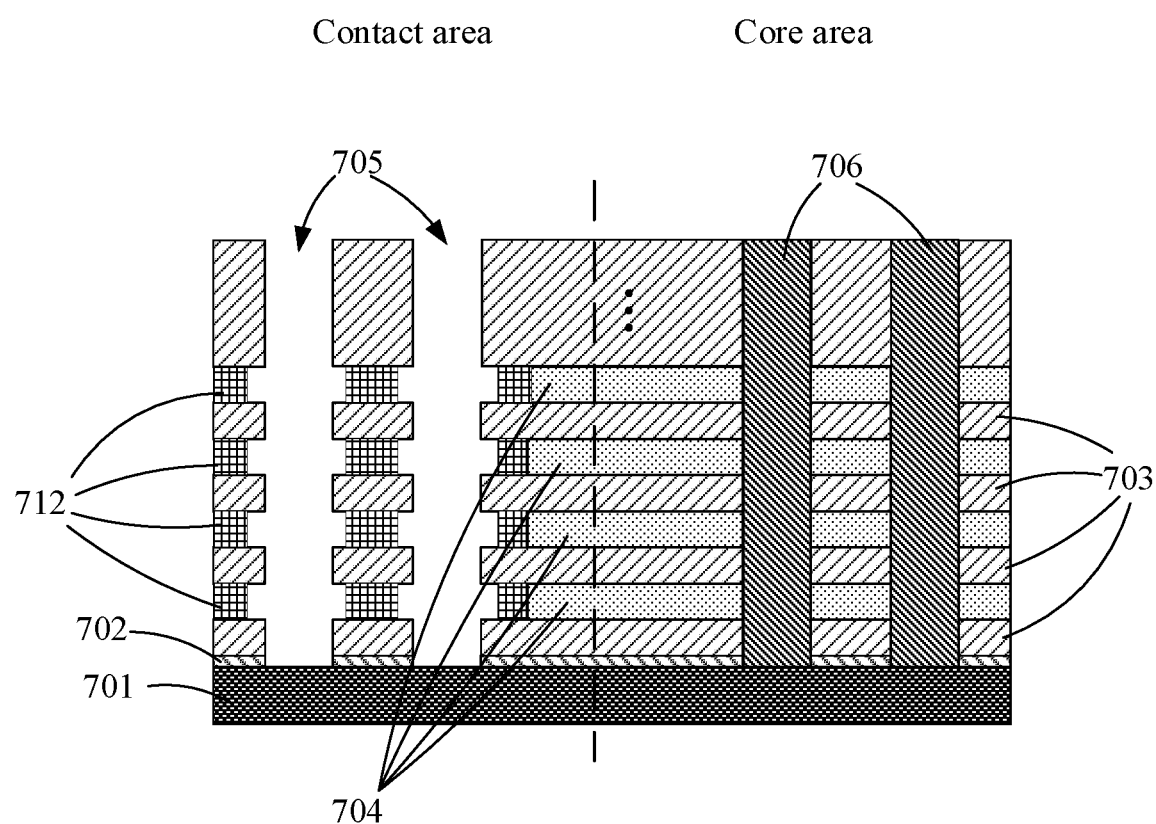
Figure 8C:
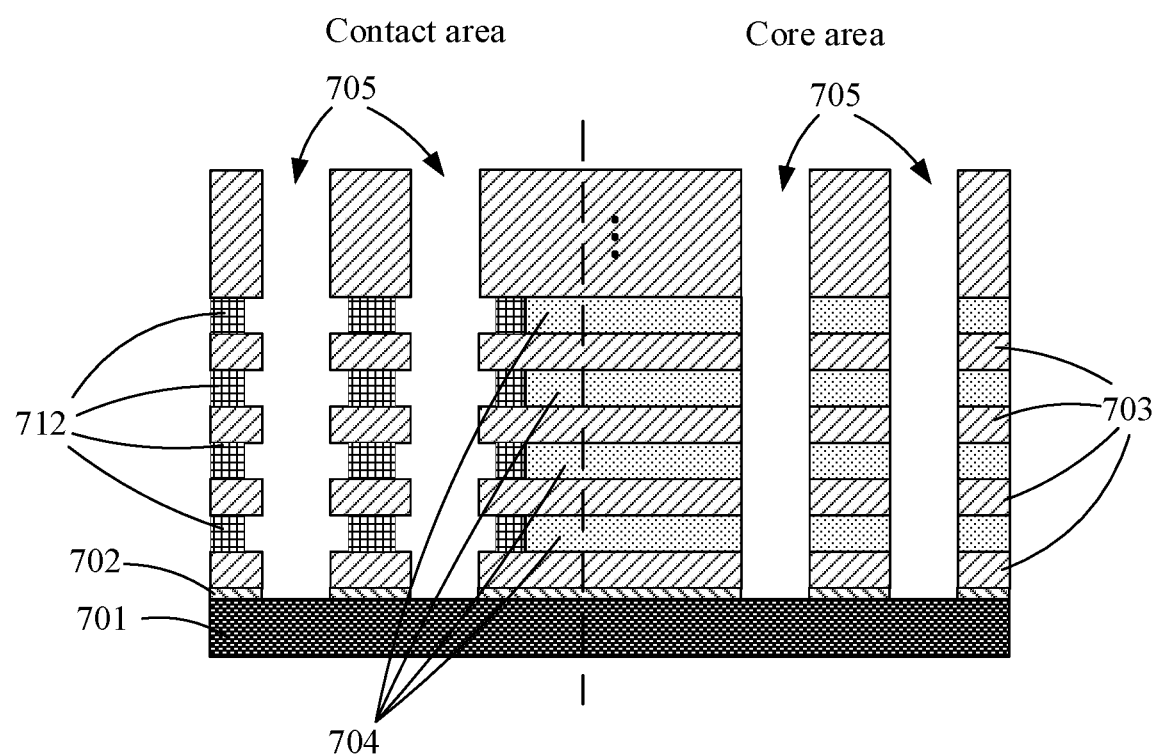

In some embodiments, as shown in FIGS. 8A-8C, during the etching process for removing the excess parts of the protection film 711, a portion of the protection film 711 inside each of the recesses 710 is also removed. That is, each of the resulting protection layers 712 is recessed in the horizontal direction. As a result, in the cross-sectional view of the semiconductor structure along the second direction (e.g., the vertical direction), the two opposite edges (e.g., the left and right edges) of each of the plurality of first channel holes have a shape of a square wave extending along the second direction, as shown in FIGS. 8A-8C. That is, in the cross-sectional view of the semiconductor structure along the second direction, a first channel hole can have a first width in the first direction at a position corresponding to a first dielectric layer 703 and a second width in the first direction at a position corresponding to a protection layer 712, and the first width is smaller than the second width. In the final memory device, first channel structures and second channel structures are formed in the first channel holes and the second channel holes, respectively. Thus, correspondingly, in the memory device, in the cross-sectional view of the memory device along the second direction, the two opposite edges (e.g., the left and right edges) of each of the plurality of first channel structures can have a shape of a square wave extending along the second direction, i.e., a first width of a first channel structure in the first direction at a position corresponding to a first dielectric layer 703 is smaller than a second width of the first channel structure in the first direction at a position corresponding to a conductor layer 113 (which replaces the corresponding protection layer 712 in the final memory device, as described above).

In an existing 3D memory device fabrication method, during a gate line slit etching process and/or a removal process of the plurality of second dielectric layers, the plurality of second dielectric layers in both of the core area and the contact area are completely removed, and hence a separate dedicated process for forming dummy channel holes in the contact area is needed after the staircase processing, which significantly increases the fabrication cost.

According to the method of fabricating a 3D memory device consistent with the present disclosure, the contact area of the semiconductor structure has a protection region within which the first channel holes are provided. The protection region surrounds a contact region. In the protection region, the plurality of second dielectric layers are substituted with a plurality of protection layers formed by a protection material. The protection material is resistant to the etching process for etching the second dielectric layers. The protection wall formed by the plurality of protection layers can remain physically and chemically stable during the gate line slit etching process and/or the removal process of the plurality of second dielectric layers. The protection region therefore can prevent the second dielectric layers in the contact region from being etched.

Further, according to the method of fabricating a 3D memory device consistent with the present disclosure, the plurality of first channel holes in the contact area can function as dummy channel holes and, with the structures surrounding thereof, provide structural support for the contact area. The first channel holes in the contact area can be formed together with the second channel holes in the core area in same etching process. No extra etching process is needed and hence fabrication cost can be further reduced.

In some embodiments, an etching process, a removing process, a filling process, and/or a deposition process described in the present disclosure can include one or more sub-processes. For example, an etching process can include a plurality of sub-processes of selective etching, a plurality of sub-processes of wet and/or dry etching, or a single-step etching. A deposition process can include a plurality of sub-processes of selective deposition, a plurality of sub-processes of deposition using different techniques, or a single-step deposition. Different techniques of deposition can include one or more of chemical vapor deposition (CVD), atomic layer deposition (ALD), sol-gel deposition, chemical bath deposition, electrodeposition, spray pyrolysis deposition, sputter deposition, etc. A removing process can include one or more of etching process, polishing process, and ashing process.

The drawings of the present disclosure illustrate semiconductor structures obtained at some stages of a method of fabricating a 3D memory device according to some embodiments of the present disclosure. There can be one or more stages between any two of the stages shown in the drawings. Similarly, there can be one or more stages before and/or after the stages shown in the drawings. Other processes, e.g., wiring, packaging, can be further performed to form the final 3D memory device, the descriptions of these processes are omitted here.

Figure 9:
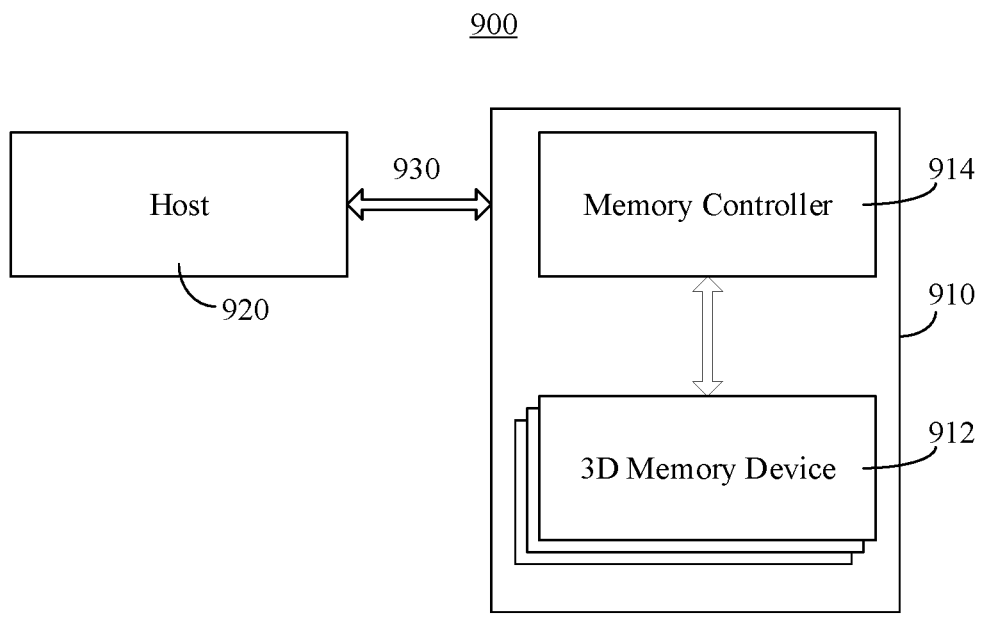
FIG. 9 is a block diagram of an example electronic device consistent with the disclosure.

FIG. 9 is a block diagram of an example electronic device 900 having a 3D memory device obtained based on a semiconductor structure consistent with the disclosure. For example, a 3D memory device according to some embodiments of the present disclosure can include the structure shown in FIG. 6, as well as other structures. The 3D memory device can include, e.g., a 3D NAND-type memory device.

The electronic device 900 can be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic device having storage therein. As shown in FIG. 9, the system 900 includes a memory system 910 and a host 920. The memory system 910 includes one or more 3D memory devices 912 and a memory controller 914. The host 920 can be a processor of the electronic device, such as a central processing unit (CPU), a microprocessor, or a system-on-chip (SoC), such as an application processor (AP). The host 920 can be configured to send or receive data to or from the one or more 3D memory devices 912. Each of the one or more 3D memory devices 912 can be obtained based on the processing wafer consistent with the disclosure.

The memory controller 914 is coupled to the one or more 3D memory devices 912 and the host 920, and is configured to control the one or more 3D memory devices 912, according to some implementations. The memory controller 914 can also be integrated into the one or more 3D memory devices 912. The memory controller 914 can manage the data stored in the one or more 3D memory devices 912 and communicate with the host 920 via an interface 930. In some embodiments, the memory controller 914 is designed for operating in a low duty-cycle environment, such as a secure digital (SD) card, a compact Flash (CF) card, a universal serial bus (USB) Flash drive, or another medium for use in electronic devices, such as personal computers, digital cameras, mobile phones, etc. In some other embodiments, the memory controller 914 is designed for operating in a high duty-cycle environment, such as a solid-state drive (SSD) or an embedded multi-media-card (eMMC) used as data storage for mobile devices, such as smartphones, tablets, laptop computers, etc., and enterprise storage arrays. The memory controller 914 can be configured to control operations of the one or more 3D memory devices 912, such as read, erase, and program operations.

The memory controller 914 and the one or more 3D memory devices 912 can be integrated into various types of storage devices, for example, be included in the same package, such as a universal Flash storage (UFS) package or an eMMC package. That is, the memory system 910 can be implemented and packaged into different types of end electronic products.

Figure 10:
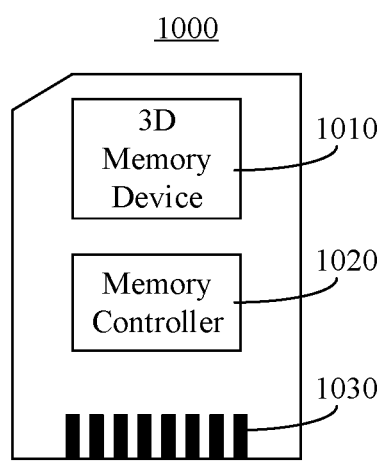
FIG. 10 is a block diagram of an example memory card consistent with the disclosure.
Figure 11:
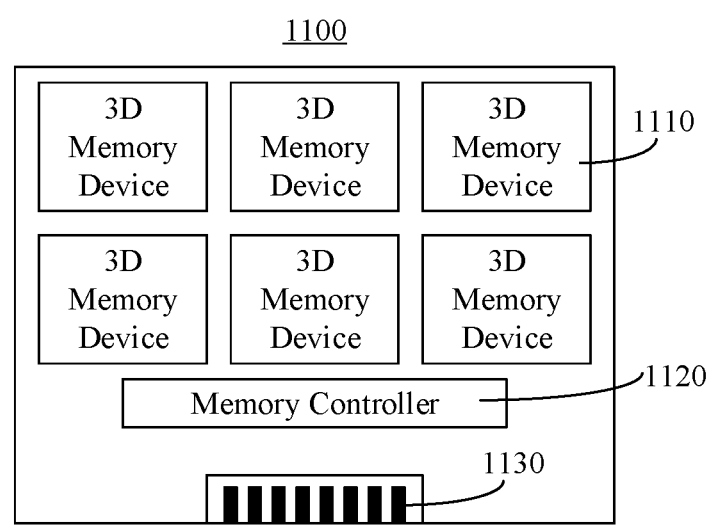
FIG. 11 is a block diagram of an example solid-state drive consistent with the disclosure.

FIGS. 10 and 11 are block diagrams of an example memory card 1000 and an example SSD 1100, respectively, consistent with the disclosure. As shown in FIG. 10, a single 3D memory device 1010 and a memory controller 1020 are integrated into the memory card 1000. The 3D memory device 1010 can include a 3D memory device obtained based on the processing wafer consistent with the disclosure, such as one of the above-described example semiconductor structure. The memory card 1000 can include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. As shown in FIG. 10, the memory card 1000 further includes a memory card interface or interface connector 1030 configured to couple the memory card 1000 to a host (e.g., the host 920 shown in FIG. 9).

As shown in FIG. 11, multiple 3D memory devices 1110 and a memory controller 1120 are integrated into the SSD 1100. Each of the 3D memory devices 1110 can include a 3D memory device obtained based on the processing wafer consistent with the disclosure, such as one of the above-described example semiconductor structure. As shown in FIG. 11, the SSD 1100 further includes an SSD interface or interface connector 1130 configured to couple the SSD 1100 to a host (e.g., the host 920 shown in FIG. 9).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A memory device fabrication method comprising:
   providing a semiconductor structure, the semiconductor structure having a core area and a contact area arranged next to each other along a first direction, the semiconductor structure including a plurality of dielectric layer pairs that include a plurality of first dielectric layers and a plurality of second dielectric layers stacked in an alternating manner in a second direction, and the second direction being approximately perpendicular to the first direction;

performing etching to form a plurality of channel holes penetrating the plurality of dielectric layer pairs, the plurality of channel holes including a plurality of first channel holes in the contact area and a plurality of second channel holes in the core area, and the plurality of first channel holes surrounding a contact region; and substituting portions of the plurality of second dielectric layers that surround the plurality of first channel holes with a protection material to form a protection wall, the protection wall surrounding the contact region.

2. The method of claim 1, wherein substituting the portions of the plurality of second dielectric layers includes:
filling the channel holes with a sacrificial material;
removing the sacrificial material in the plurality of first channel holes;
etching, through the first channel holes, the portions of the plurality of second dielectric layers that surround the plurality of first channel holes to form a plurality of recesses; and
filling the protection material in the plurality of recesses to form the protection wall.

3. The method of claim 2, wherein filling the protection material in the plurality of recesses includes:
depositing the protection material to fill the recesses and to at least partially fill the plurality of first channel holes;
performing etching to remove portions of the protection material outside the plurality of recesses, leaving at least a portion of the protection material filled in the plurality of recesses.

4. The method of claim 2, wherein substituting the portions of the plurality of second dielectric layers further includes:
after filling the channel holes with the sacrificial material and before removing the sacrificial material in the plurality of first channel holes:
depositing a cap film to cover an upper surface of the semiconductor structure; and
removing portions of the cap film to expose the sacrificial material in the plurality of first channel holes while keeping the plurality of second channel holes covered by the cap film; and
after filling the protection material in the plurality of recesses:
removing the cap film; and
removing the sacrificial material in the plurality of second channel holes.

5. The method of claim 2, wherein the sacrificial material includes polysilicon or carbon.

6. The method of claim 2, wherein filling the channel holes with the sacrificial material includes:
depositing the sacrificial material; and
performing polishing to remove excess sacrificial material outside the channel holes.

7. The method of claim 1, further comprising:
forming one or more through contact structures in the contact region and a plurality of extensions each surrounding one of the one or more through contact structures, the one or more through contact structures penetrating the plurality of dielectric layer pairs in the second direction.

8. The method of claim 7, further comprising, before forming the one or more through contact structures and the plurality of extensions:
performing etching to remove the plurality of second dielectric layers in the core area and to remove the plurality of second dielectric layers in the contact area except the contact region;
removing the protection material; and
filling one or more conductive materials in empty spaces between adjacent two of the plurality of first dielectric layers to form a plurality of conductor layers.

9. The method of claim 8, wherein:
the one or more conductive materials are one or more first conductive materials; and
forming the one or more through contact structures and the plurality of extensions includes:
performing etching in the contact region to form one or more contact holes and a plurality of recesses, each of the plurality of recesses surrounding one of the one or more contact holes and being formed by removing a portion of a corresponding one of the plurality of second dielectric layers that surrounds the one of the one or more contact holes, and each of the plurality of recesses exposing a portion of a side of a corresponding one of the plurality of conductor layers; and
filling one or more second conductive materials in the plurality of recesses to form the plurality of extensions and filling one or more third conductive materials in the one or more contact holes to form the one or more through contact structures.

10. The method of claim 9, wherein the one or more first conductive materials are in contact with the one or more second conductive materials, and the one or more second conductive materials are in contact with the one or more third conductive materials.

11. The method of claim 9, wherein the one or more first conductive materials are same as the one or more second conductive materials.

12. The method of claim 8, further comprising, before removing the protection material:
performing gate line slit etching.

13. The method of claim 1, wherein the plurality of first channel holes are arranged along four sides of a rectangle, and the rectangle surrounds the contact region.

14. The method of claim 13, wherein each of two parallel sides of the rectangle includes a single row of the plurality of first channel holes, and each of other two parallel sides of the rectangle includes a single column of the plurality of first channel holes.

15. A memory device having a contact area and a core area next to each other along a first direction, and comprising:
a plurality of first dielectric layers stacked in a second direction approximately perpendicular to the first direction and extending across the contact area and the core area;
a plurality of second dielectric layers in a contact region in the contact area, each of the plurality of second dielectric layers being sandwiched between adjacent two of the plurality of first dielectric layers; and
a plurality of conductor layers in the core area and in a protection region in the contact area, the protection region surrounding the contact region, and each of the plurality of conductor layers being sandwiched between adjacent two of the plurality of first dielectric layers and being co-layered with one of the plurality of second dielectric layers.

16. The memory device of claim 15, further comprising:
a plurality of first channel structures arranged in the protection region and surrounding the contact region, a portion of the plurality of first channel structures being arranged at an edge of the contact area that is distal to the core area; and
a plurality of second channel structures arranged in the core area.

17. The memory device of claim 16, wherein in a cross-sectional view of the memory device along the second direction, each of the plurality of first channel structures has a first width along the first direction at a position corresponding to one of the plurality of first dielectric layers and a second width along the first direction at a position corresponding to one of the plurality of conductor layers, and the first width being smaller than the second width.

18. The memory device of claim 16, wherein:
the plurality of conductor layers in the protection region form a conductor wall surrounding the contact region.

19. The memory device of claim 18, wherein a side surface of the conductor wall protrudes towards the contact region at a position corresponding to one of the plurality of first channel structures further than at a position corresponding to a point between two neighboring ones of the plurality of first channel structures.

20. A memory system comprising:
a memory device having a contact area and a core area next to each other along a first direction, and including:
a plurality of first dielectric layers stacked in a second direction approximately perpendicular to the first direction and extending across the contact area and the core area;
a plurality of second dielectric layers in a contact region in the contact area, each of the plurality of second dielectric layers being sandwiched between adjacent two of the plurality of first dielectric layers; and
a plurality of conductor layers in the core area and in a protection region in the contact area, the protection region surrounding the contact region, and each of the plurality of conductor layers being sandwiched between adjacent two of the plurality of first dielectric layers and being co-layered with one of the plurality of second dielectric layers; and
a memory controller configured to control operation of the memory device.

* * * * *